US012148816B2

United States Patent
Colinge et al.

(10) Patent No.: US 12,148,816 B2
(45) Date of Patent: Nov. 19, 2024

(54) DEVICES HAVING A SEMICONDUCTOR MATERIAL THAT IS SEMIMETAL IN BULK AND METHODS OF FORMING THE SAME

(71) Applicant: Taiwan Semiconductor Manufacturing Co., Ltd., Hsinchu (TW)

(72) Inventors: Jean-Pierre Colinge, Blot l'Eglise (FR); Carlos H Diaz, Los Altos Hills, CA (US); Yee-Chia Yeo, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/717,799

(22) Filed: Apr. 11, 2022

(65) Prior Publication Data

US 2022/0238704 A1 Jul. 28, 2022

Related U.S. Application Data

(60) Continuation of application No. 17/079,853, filed on Oct. 26, 2020, now Pat. No. 11,302,804, which is a
(Continued)

(51) Int. Cl.
*H01L 29/66* (2006.01)
*H01L 21/02* (2006.01)
(Continued)

(52) U.S. Cl.
CPC .. *H01L 29/66969* (2013.01); *H01L 21/02521* (2013.01); *H01L 21/02573* (2013.01);
(Continued)

(58) Field of Classification Search
CPC ......... H01L 29/66969; H01L 21/02521; H01L 21/02573; H01L 21/02576;
(Continued)

(56) References Cited

U.S. PATENT DOCUMENTS

| 5,554,870 A | 9/1996 | Fitch et al. |
| 6,107,660 A | 8/2000 | Yang et al. |

(Continued)

FOREIGN PATENT DOCUMENTS

| CN | 1581512 | 2/2005 |
| CN | 101399207 | 4/2009 |

(Continued)

OTHER PUBLICATIONS

Antcliffe, G.A., et al., "Band Structure of Doped Bismuth Using the Shubnikov-de Haas Effect," Physics Review, vol. 160, No. 3, Aug. 15, 1967, pp. 531-537.
(Continued)

*Primary Examiner* — Cuong B Nguyen
(74) *Attorney, Agent, or Firm* — Slater Matsil, LLP

(57) ABSTRACT

Devices, and methods of forming such devices, having a material that is semimetal when in bulk but is a semiconductor in the devices are described. An example structure includes a substrate, a first source/drain contact region, a channel structure, a gate dielectric, a gate electrode, and a second source/drain contact region. The substrate has an upper surface. The channel structure is connected to and over the first source/drain contact region, and the channel structure is over the upper surface of the substrate. The channel structure has a sidewall that extends above the first source/drain contact region. The channel structure comprises a bismuth-containing semiconductor material. The gate dielectric is along the sidewall of the channel structure. The gate electrode is along the gate dielectric. The second source/drain contact region is connected to and over the channel structure.

20 Claims, 24 Drawing Sheets

Related U.S. Application Data continuation of application No. 16/570,663, filed on Sep. 13, 2019, now Pat. No. 10,818,780, which is a division of application No. 15/905,978, filed on Feb. 27, 2018, now Pat. No. 10,461,179, which is a division of application No. 15/404,712, filed on Jan. 12, 2017, now Pat. No. 9,929,257, which is a division of application No. 14/656,948, filed on Mar. 13, 2015, now Pat. No. 9,564,493.

(51) Int. Cl.

| | | |
|---|---|---|
| *H01L 21/426* | (2006.01) | |
| *H01L 21/441* | (2006.01) | |
| *H01L 21/461* | (2006.01) | |
| *H01L 21/477* | (2006.01) | |
| *H01L 21/762* | (2006.01) | |
| *H01L 21/768* | (2006.01) | |
| *H01L 21/8234* | (2006.01) | |
| *H01L 21/8256* | (2006.01) | |
| *H01L 21/8258* | (2006.01) | |
| *H01L 27/06* | (2006.01) | |
| *H01L 27/088* | (2006.01) | |
| *H01L 27/12* | (2006.01) | |
| *H01L 29/04* | (2006.01) | |
| *H01L 29/06* | (2006.01) | |
| *H01L 29/08* | (2006.01) | |
| *H01L 29/10* | (2006.01) | |
| *H01L 29/24* | (2006.01) | |
| *H01L 29/267* | (2006.01) | |
| *H01L 29/423* | (2006.01) | |
| *H01L 29/78* | (2006.01) | |
| *H01L 29/786* | (2006.01) | |
| H01L 21/8238 | (2006.01) | |
| H01L 27/092 | (2006.01) | |

(52) U.S. Cl.
CPC .. *H01L 21/02576* (2013.01); *H01L 21/02579* (2013.01); *H01L 21/02598* (2013.01); *H01L 21/0262* (2013.01); *H01L 21/02636* (2013.01); *H01L 21/02667* (2013.01); *H01L 21/426* (2013.01); *H01L 21/441* (2013.01); *H01L 21/461* (2013.01); *H01L 21/477* (2013.01); *H01L 21/76224* (2013.01); *H01L 21/76895* (2013.01); *H01L 21/823412* (2013.01); *H01L 21/823487* (2013.01); *H01L 21/8256* (2013.01); *H01L 21/8258* (2013.01); *H01L 27/0688* (2013.01); *H01L 27/088* (2013.01); *H01L 27/1207* (2013.01); *H01L 27/1222* (2013.01); *H01L 27/127* (2013.01); *H01L 29/04* (2013.01); *H01L 29/0649* (2013.01); *H01L 29/0847* (2013.01); *H01L 29/1033* (2013.01); *H01L 29/24* (2013.01); *H01L 29/267* (2013.01); *H01L 29/42392* (2013.01); *H01L 29/66742* (2013.01); *H01L 29/7827* (2013.01); *H01L 29/78618* (2013.01); *H01L 29/78642* (2013.01); *H01L 29/78681* (2013.01); *H01L 29/78696* (2013.01); *H01L 21/823885* (2013.01); *H01L 27/092* (2013.01)

(58) Field of Classification Search
CPC ......... H01L 21/02579; H01L 21/02598; H01L 21/0262; H01L 21/02636; H01L 21/02667; H01L 21/426; H01L 21/441; H01L 21/461; H01L 21/477; H01L 21/76224; H01L 21/76895; H01L 21/823412; H01L 21/823487; H01L 21/8256; H01L 21/8258; H01L 27/0688; H01L 27/088; H01L 27/1207; H01L 27/1222; H01L 27/127; H01L 29/04; H01L 29/0649; H01L 29/0847; H01L 29/1033; H01L 29/24; H01L 29/267; H01L 29/42392; H01L 29/66742; H01L 29/78618; H01L 29/78642; H01L 29/78681; H01L 29/78696; H01L 21/823885; H01L 27/092; H01L 21/823807; H01L 29/41791; H01L 29/66272; H01L 29/66666; H01L 29/66712; H01L 29/66795; H01L 29/66909; H01L 29/732; H01L 29/7371; H01L 29/7395; H01L 29/7788; H01L 29/7827–7834; H01L 29/7889; H01L 29/7926; H01L 29/8083–8086
See application file for complete search history.

(56) References Cited

U.S. PATENT DOCUMENTS

| | | |
|---|---|---|
| 6,387,758 B1 * | 5/2002 | Yu .................... H01L 29/7827 |
| | | 438/269 |
| 6,506,638 B1 | 1/2003 | Yu |
| 6,740,910 B2 | 5/2004 | Roesner et al. |
| 7,667,271 B2 | 2/2010 | Yu et al. |
| 7,736,979 B2 | 6/2010 | Farrow et al. |
| 7,736,989 B2 | 6/2010 | Farrow et al. |
| 7,759,729 B2 | 7/2010 | Bjoerk et al. |
| 7,892,956 B2 | 2/2011 | Deligianni et al. |
| 8,076,231 B2 | 12/2011 | Saitoh et al. |
| 8,093,664 B2 | 1/2012 | Gomikawa et al. |
| 8,164,146 B2 | 4/2012 | Lung |
| 8,319,316 B2 | 11/2012 | Kutsukake et al. |
| 8,362,575 B2 | 1/2013 | Kwok et al. |
| 8,367,498 B2 | 2/2013 | Chang et al. |
| 8,395,197 B2 | 3/2013 | Nagai |
| 8,440,517 B2 | 5/2013 | Lin et al. |
| 8,497,528 B2 | 7/2013 | Lee et al. |
| 8,610,240 B2 | 12/2013 | Lee et al. |
| 8,633,075 B2 | 1/2014 | Shima |
| 8,653,570 B2 | 2/2014 | Konishi |
| 8,680,576 B2 | 3/2014 | Ching et al. |
| 8,716,774 B2 | 5/2014 | Mikasa |
| 8,723,272 B2 | 5/2014 | Liu et al. |
| 8,729,627 B2 | 5/2014 | Cheng et al. |
| 8,729,634 B2 | 5/2014 | Shen et al. |
| 8,772,771 B2 | 7/2014 | Tanaka |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,999,805 B1 | 4/2015 | Colinge et al. |
| 9,024,415 B2 | 5/2015 | Zhang et al. |
| 9,040,343 B2 | 5/2015 | Enomoto et al. |
| 2005/0227425 A1 | 10/2005 | Henley |
| 2005/0255667 A1 | 11/2005 | Arghavani et al. |
| 2007/0082448 A1 | 4/2007 | Kim et al. |
| 2007/0284623 A1 | 12/2007 | Kim et al. |
| 2008/0197418 A1 | 8/2008 | Parthasarathy et al. |
| 2009/0020764 A1 | 1/2009 | Anderson et al. |
| 2009/0215277 A1 | 8/2009 | Lee et al. |
| 2009/0242990 A1 | 10/2009 | Saitoh et al. |
| 2010/0019276 A1 | 1/2010 | Jang |
| 2010/0176459 A1 | 7/2010 | Wernersson et al. |
| 2010/0210096 A1 * | 8/2010 | Masuoka ............ H01L 29/7827 |
| | | 438/692 |
| 2010/0301402 A1 | 12/2010 | Masuoka et al. |
| 2011/0068407 A1 | 3/2011 | Yeh et al. |
| 2011/0068418 A1 | 3/2011 | Lung |
| 2011/0084314 A1 * | 4/2011 | Or-Bach ............ H01L 29/808 |
| | | 257/209 |

(56) References Cited

U.S. PATENT DOCUMENTS

| | | | |
|---|---|---|---|
| 2011/0294295 A1 | 12/2011 | Zhu et al. | |
| 2011/0303973 A1* | 12/2011 | Masuoka | H01L 29/66772 |
| | | | 257/329 |
| 2011/0303985 A1 | 12/2011 | Masuoka et al. | |
| 2012/0009749 A1 | 1/2012 | Tan et al. | |
| 2012/0018704 A1 | 1/2012 | Wallis et al. | |
| 2012/0025169 A1 | 2/2012 | Mars et al. | |
| 2012/0061838 A1 | 3/2012 | Edelstein et al. | |
| 2012/0098120 A1 | 4/2012 | Yu et al. | |
| 2012/0138887 A1 | 6/2012 | Zhang et al. | |
| 2012/0171825 A1* | 7/2012 | Masuoka | H01L 29/7827 |
| | | | 257/E21.643 |
| 2012/0223288 A1 | 9/2012 | Kim et al. | |
| 2012/0273763 A1 | 11/2012 | Banerjee et al. | |
| 2012/0295074 A1 | 11/2012 | Yi et al. | |
| 2013/0011983 A1 | 1/2013 | Tsai et al. | |
| 2013/0341702 A1 | 12/2013 | Kar et al. | |
| 2014/0166981 A1 | 6/2014 | Doyle et al. | |
| 2014/0197458 A1 | 7/2014 | Ching et al. | |
| 2014/0225184 A1 | 8/2014 | Colinge et al. | |
| 2014/0252412 A1 | 9/2014 | Tsai et al. | |
| 2014/0332859 A1 | 11/2014 | Colinge et al. | |
| 2015/0048441 A1 | 2/2015 | Colinge et al. | |
| 2015/0069475 A1 | 3/2015 | Colinge et al. | |
| 2015/0171032 A1 | 6/2015 | Colinge et al. | |
| 2016/0078922 A1* | 3/2016 | Liaw | H01L 29/7827 |
| | | | 365/51 |

FOREIGN PATENT DOCUMENTS

| | | |
|---|---|---|
| CN | 101483192 A | 7/2009 |
| CN | 101933126 A | 12/2010 |
| CN | 102290441 | 12/2011 |
| CN | 102446935 | 5/2012 |
| CN | 103238101 | 8/2013 |
| EP | 0182925 B1 * | 5/1989 |
| JP | 2009239167 A | 10/2009 |
| KR | 20060012724 A | 2/2006 |
| KR | 100712552 B2 | 4/2007 |
| KR | 100771871 B1 | 11/2007 |

OTHER PUBLICATIONS

Baek, C.-K., et al., "Characteristics of Gate-all-Around Silicon Nanowire Field Effect Transistors with Asymmetric Channel Width and Source/Drain Doping Concentration," Journal of Applied Physics 112, Aug. 13, 2012, pp. 034513-1-034513-5.

Bindal, A., et al. "Exploratory Study on Power-Efficient Silicon Nano-Wire Dynamic NMOSFET/PMESFET Logic" IET Sci. Meas. Technol. 2007, vol. 1, No. 2, 2007, pp. 121-130.

Bindal, A., et al. "The Design of DualWork Function CMOS Transistors and Circuits Using Silicon Nanowire Technology" IEEE Transactions on Nanotechnology, May 2007, vol. 6, No. 3, pp. 291-302.

Cea S.M et al., "Process Modeling for Advanced Device Technologies," J. Comput. Electron, vol. 13, Issue 1, pp. 18-32, Aug. 6, 2013.

Cho, H.-J. et al., "Investigation of Gate Etch Damage at Metal/High-k Gate Dielectric Stack Through Random Telegraph Noise in Gate Edge Direct Tunneling Current," IEEE Electron Device Letters, vol. 32, No. 4, Apr. 2011, pp. 569-571.

Chu, M., et al., "Strain: A Solution for Higher Carrier Mobility in Nanoscale MOSFETs," Annual Reviews, vol. 39, 2009, pp. 203-229.

Dresselhaus, M.S., et al., "Carbon Nanotubes and Bismuth Nanowires," Chapter 3, Nanoengineering of Structural, Functional and Smart Materials, M.J. Schulz, A.D. Kelkar and M.J. Sundaresan Eds, CRC Press, Taylor and Francis Group (2005), 41 pages.

Ferain, I. et al., "Multigate transistors as the future of classical metal-oxide-semiconductor field-effect transistors," Nature, vol. 479, Nov. 17, 2011, pp. 2-8.

Flachowsky, S., et al., "Understanding Strain-Induced Drive-Current Enhancement in Strained-Silicon n-MOSFET and p-MOSFET," IEEE Transactions on Electron Devices, vol. 57, No. 6, Jun. 2010, pp. 1343-1354.

Gandhi, R. et al., "Vertical Si-Nanowire n-Type Tunneling FETs With Low Subthreshold Swing (<50 mV/decade) at Room Temperature," IEEE Electron Device Letters, vol. 32, No. 4, Apr. 2011, pp. 437-439.

Gundapaneni, et al., "Enhanced Electrostatic Integrity of Short-Channel Junctionless Transistor With High-K Spacers," IEEE Electron Device Letters, vol. 32, No. 10, Oct. 2011, pp. 1325-1327.

Hamedi-Hagh, S., et al. "Design of Next Generation Amplifiers Using Nanowire FETs," Journal of Electrical Engineering & Technology 2008, vol. 3, No. 4, pp. 566-570.

Hamedi-Hagh, S., et al., "Spice Modeling of Silicon Nanowire Field-Effect Transistors for High-Speed Analog Integrated Circuits," IEEE Transactions on Nanotechnology vol. 7 No. 6, Nov. 2008, pp. 766-775.

Hashemi, P., et al., "Gate-All-Around n-MOSFETs Wtih Uniaxial Tensile Strain-Induced Performance Enhancement Scalable to Sub-10-nm Nanowire Diameter," IEEE Electron Device Letters, vol. 30, Issue 4, Apr. 2009, pp. 401-403.

Ionescu, A.M. et al., "Tunnel field-effect transistors as energy-efficient electronic switches," Review, doi: 10.1038/nature 10679, Nature, vol. 479 Nov. 17, 2011, pp. 329-337.

Jin, S., et al., "A three-dimensional simulation of quantum transport in silicon nanowire transistor in the presence of electron-phonon interactions," Journal of Applied Physics 99, 2006, pp. 123719-1-123719-10.

Kim, K., "Future Silicon Technology," 2012 Proceedings of the European Solid State Device Research Conference, pp. 1-6.

Kwong, D.-L. et al., "Vertical Silicon Nanowire Platform for Low Power Electronics and Clean Energy Applications," Hindawi Publishing Corporation, Journal of Nanotechnology, vol. 2012, Article ID 492121, pp. 1-21.

Larrieu, G. et al., "Vertical nanowire array-based field effect transistors for ultimate scaling," The Royal Society of Chemistry, Jan. 2013, pp. 2437-2441.

Lee, Sangwoo et al., "The Effects of Texture and Doping on the Young's Modulus of Polysilicon," Mat. Res. Soc. Symp. Proc., vol. 518, Material Research Society, 1999, pp. 1-26.

Lee, S., "Direct observation of the semimetal-to-semiconductor transition of individual single-crystal bismuth nanowires grown by on-film formation of nanowires," IOP Publishing, Nanotechnology 21 (2010) 405701, pp. 1-6.

Lee, et al., "Short-Channel Junctionless Nanowire Transistors", 2010, http://www.sinano.eu/data/document/latenews.pdf, 2 pages.

Lee, et al., "Performance estimation of junctionless multigate transistors", Solid-State Electronics, vol. 54, Issue 2, Feb. 2010, pp. 97-103.

Li, L., et al., "A route to fabricate single crystalline bismuth nanowire arrays with different diameters," Chemical Physics Letters 378 (2003), pp. 244-249.

Li, L., et al., "Synthetic control of large-area, ordered bismuth nanowire arrays," Science Direct, Materials Letters 59 (2005), pp. 1223-1226.

Li, C., et al., "Bismuth nano-droplets for group-V based molecular-beam droplet epitaxy," AIP Applied Physics Letters, Applied Physics Letters 99, (2011) pp. 243113-1-243113-3.

Liang, J. et al., "Relaxation of compressed elastic islands on a viscous layer," Pergamon, www.actamat-journals.com, Acta Materialia 50 (2002) 2933-2944.

Limmer, S., "Recrystallized Arrays of Bismuth Nanowires with Trigonal Orientation," Nano Letters, 2014, vol. 14, pp. 1927-1931.

Lin, Y-M., et al, "Transport properties of Bi nanowire arrays," Applied Physics Letters, vol. 76, No. 26, Jun. 26, 2000, pp. 3944-3946.

Maheshwaram, S., et al., "Device Circuit Co-Design Issues in Vertical Nanowire CMOS Platform," IEEE Electron Device Letters, vol. 33, Issue 7, Jul. 2012, pp. 934-936.

Niquet, Y.-M. et al., "Carrier Mobility in strained Ge nanowires," Journal of Applied Physics 112, , 084301 (2012), pp. 084301-1-084301-4.

(56) References Cited

OTHER PUBLICATIONS

Partin, D.L., et al., "Growth and characterization of epitaxial bismuth films," Physical Review B, vol. 38, No. 6, Aug. 15, 1988, pp. 3818-3825.

Peng, Y., et al., "Bismuth quantum-wires arrays fabricated by electrodeposition in nanoporous anodic aluminum oxide and its structural properties," Materials Science and Engineering B77 (2000), pp. 246-249.

Peterson, R.L. et al., "Comment on Fabrication of Strained Silicon on Insulator by Strain Transfer Process [Appl. Phys. Lett. 87, 051921 (2005)]," Appl. Phys. Lett. 88, 146101 (2006), 3 pages.

Pham-Nguyen, et al., "Mobility enhancement by CESL strain in short-channel ultrathin SOI MOSFETs," Solid-State Electronics 54, www.elesevier.com/locate/sse, pp. 123-130, Dec. 2009.

Sakui, K., et al., "A new vertical MOSFET Vertical Logic Circuit (VLC) MOSFE* suppressing asymmetric characteristics and realizing an ultra compact and robust logic circuit", 2009 Semiconductor Device Research Symposium (ISDRS), Dec. 9-11, 2009, 2 pages.

Sato, S., et al., "Electrical characteristics of asymmetrical silicon nanowire field-effect transistors," Applied Physics Letters 99, Dec. 2, 2011, pp. 223518-1-223518-3.

Schmidt, V. et al., "Realization of a Silicon Nanowire Vertical Surround-Gate Field-Effect Transistor," Small, vol. 2, Issue 1, Jan. 2006, pp. 85-88.

Shen, N. et al., "Vertical GAA Silicon Nanowire Transistor with Impact of Temperature on Device Parameters," World Academy of Science, Engineering and Technology, Issue 48, Dec. 2010, pp. 976-979.

Shim, W., et al., "Shubnikov-de Haas oscillations in an individual single-crystalline bismuth nanowire grown by on-film formation of nanowires," Applied Physics Letters 95, (2009), pp. 232107-1-232107-3.

Shim, W., et al., "On-Film Formation of Bi Nanowires with Extraordinary Electron Mobility," Nano Lett., 2009, 9 (1), pp. 18-22.

Shir, D., et al., "Oxidation of Silicon Nanowires," Journal of Vacuum Science & Technology B, May 2006, pp. 1333-1336.

Sigma-Aldrich, "Bismuth", http://www.sigmaaldrich.com/materials-science/material-science-products.html?TablePage=19927132, 1 page.

Sleight, J.W., et al. "Gate-All-Around Silicon Nanowire MOSFETs and Circuits," Device Research Conference (DRC), Jun. 21-23, 2010, pp. 269-272.

Sun, Y. et al., "Junctionless Vertical-Si-Nanowire-Channel-Based SONOS Memory With 2-Bit Storage per Cell," IEEE Electron Device Letters, vol. 32, Issue 6, Jun. 2011, pp. 725-727.

Sun, Y., et al. "Demonstration of Memory String with Stacked Junction-Less SONOS Realized on Vertical Silicon Nanowire," 2011 IEEE International Electron Devices Meeting (IEDM, Dec. 5-7, 2011, pp. 9.7.1-9.7.4.

Sun, Y. et al. "Junction-Less Stackable SONOS Memory Realized on Vertical-Si-Nanowire for 3-D Application," 3rd IEEE International Memory Workshop (IMW), May 22-25, 2011, pp. 1-4.

Thelander, C. et al., "Nanowire-based one-dimensional electronics," Materials Today, vol. 9, Issue 10, Oct. 2006, pp. 28-35.

Tomioka, K. et al., "A III-V nanowire channel on silicon for high-performance vertical transistors," Nature, vol. 488, Aug. 9, 2012, 14 pages.

\* cited by examiner

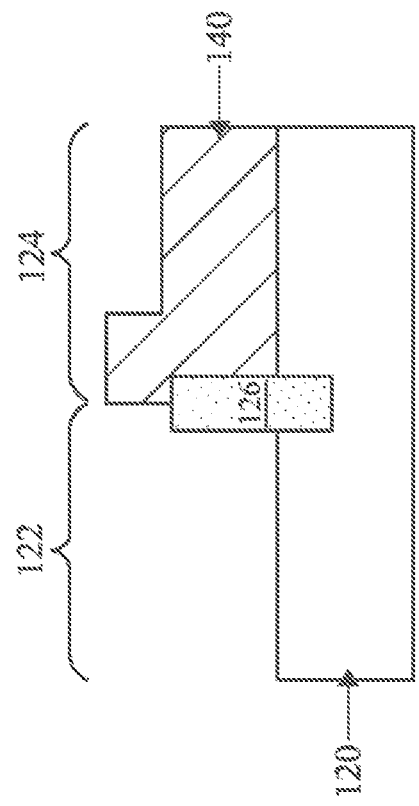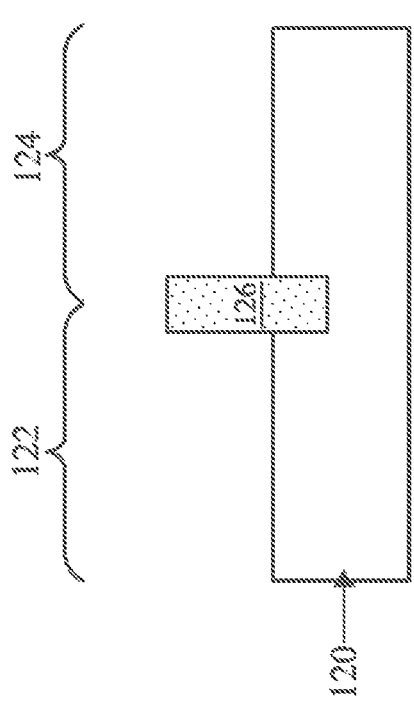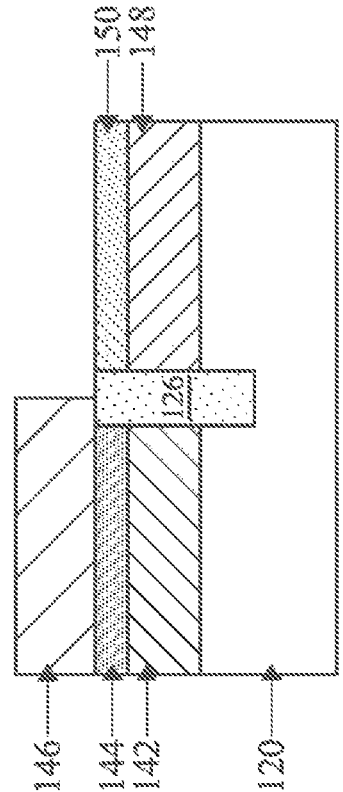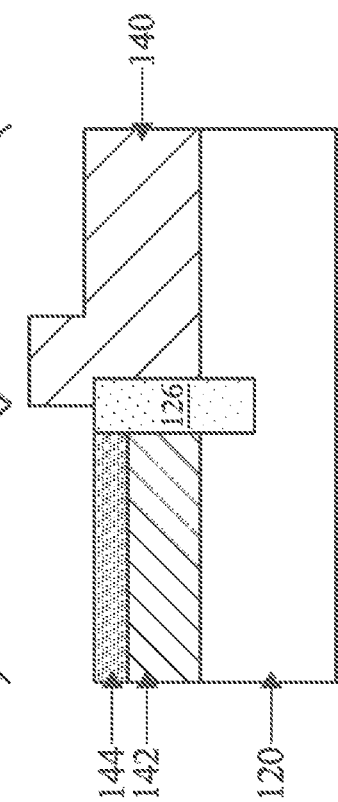

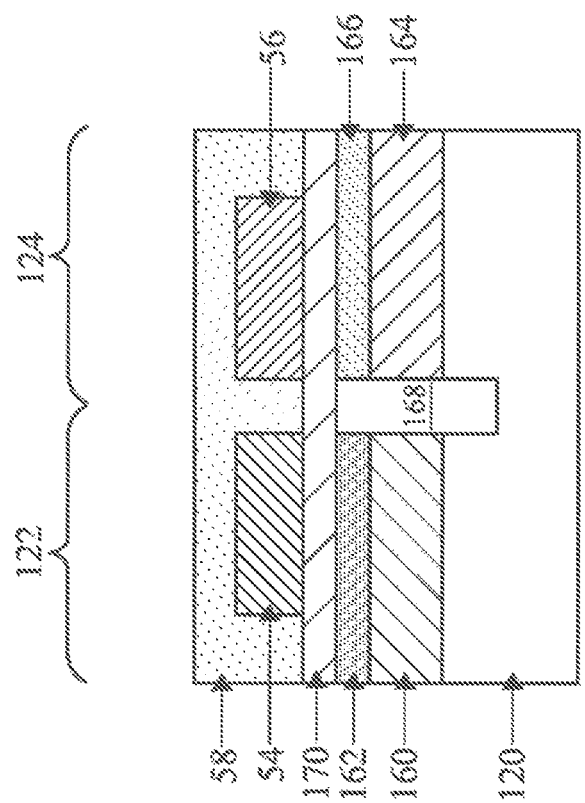
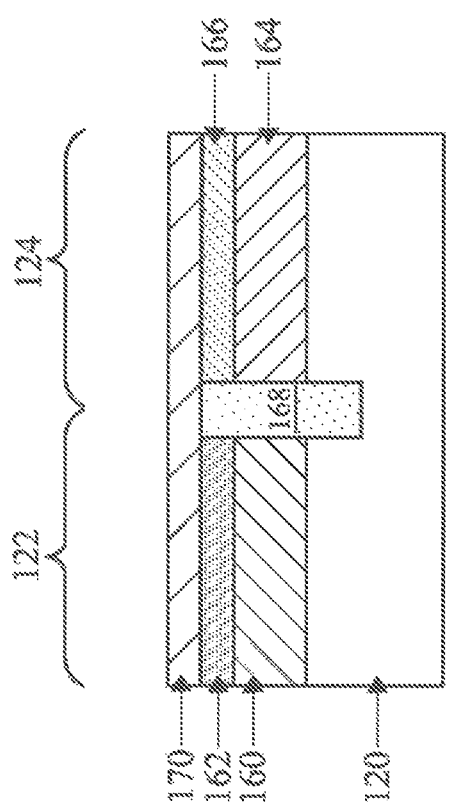
Fig. 25
Fig. 24

DEVICES HAVING A SEMICONDUCTOR MATERIAL THAT IS SEMIMETAL IN BULK AND METHODS OF FORMING THE SAME

PRIORITY CLAIM AND CROSS-REFERENCE

This application is a continuation of and claims priority to U.S. patent application Ser. No. 17/079,853, filed on Oct. 26, 2020, and entitled, "Devices Having a Semiconductor Material That Is Semimetal in Bulk and Methods of Forming the Same," which is a continuation of and claims priority to U.S. patent application Ser. No. 16/570,663, filed on Sep. 13, 2019, and entitled, "Devices Having a Semiconductor Material That Is Semimetal in Bulk and Methods of Forming the Same," now U.S. Pat. No. 10,818,780 issued Oct. 27, 2020, which is a divisional of and claims priority to U.S. patent application Ser. No. 15/905,978, filed on Feb. 27, 2018, and entitled, "Devices Having a Semiconductor Material That Is Semimetal in Bulk and Methods of Forming the Same," now U.S. Pat. No. 10,461,179 issued Oct. 29, 2019, which is a divisional of and claims priority to U.S. patent application Ser. No. 15/404,712, filed on Jan. 12, 2017, and entitled, "Devices Having a Semiconductor Material That Is Semimetal in Bulk and Methods of Forming the Same," now U.S. Pat. No. 9,929,257 issued Mar. 27, 2018, which is a divisional of and claims priority to U.S. patent application Ser. No. 14/656,948, filed on Mar. 13, 2015, and entitled, "Devices Having a Semiconductor Material That Is Semimetal in Bulk and Methods of Forming the Same," now U.S. Pat. No. 9,564,493 issued Feb. 7, 2017, which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor. An overall operation speed of an integrated circuit, and hence, the operation speed of equipment using the integrated circuit, can be affected by an operation speed of transistors in the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19 through 22 are cross sectional views of intermediate stages of a second manufacturing process to form highly doped source/drain contact regions on a semiconductor substrate in accordance with some embodiments.

FIGS. 24 through 32 are cross sectional views of intermediate stages of manufacturing another complementary transistor structure in accordance with some embodiments.

DETAILED DESCRIPTION

Figure 2:
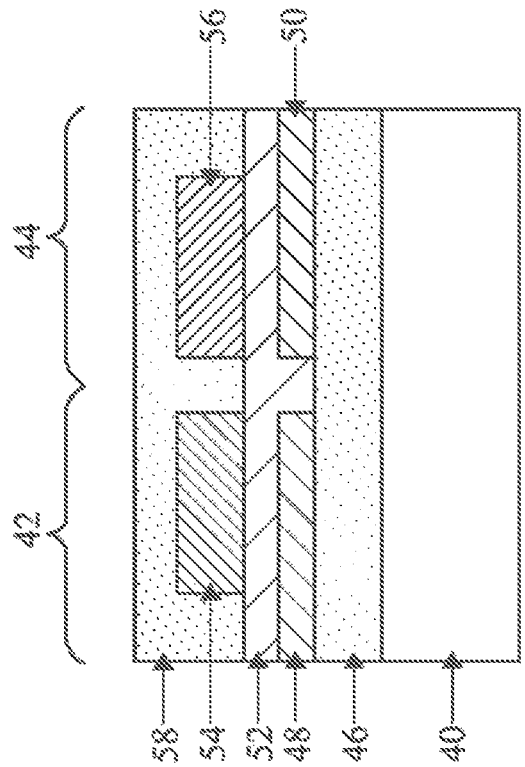
FIGS. 1 through 9 are cross sectional views of intermediate stages of manufacturing a complementary transistor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Devices, such as transistors, and more particularly, vertical channel transistors, and methods of forming the same are provided in accordance with various embodiments. These devices can incorporate a material that is semimetal in bulk form but is a semiconductor as incorporated in the devices. Intermediate stages of forming the devices are illustrated. Some variations of the embodiments are discussed herein. Throughout the various views and illustrative embodiments, like reference numbers are used to designate like elements. Although method embodiments are discussed in a particular order, various other method embodiments may be performed in any logical order and may include fewer or more steps described herein.

Figure 10A:
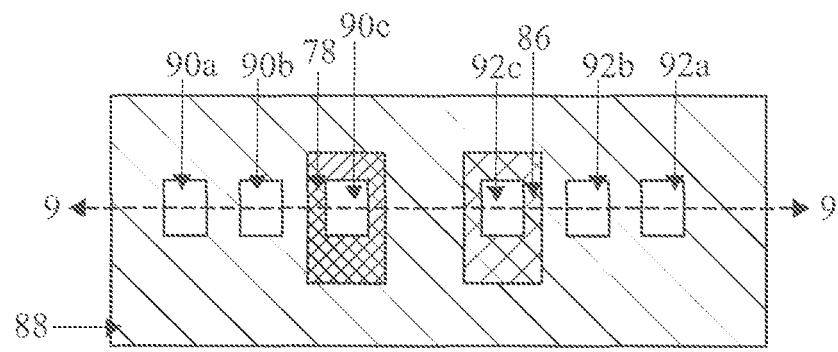
FIGS. 10A through 10C are overlaid layout views of the structure in FIG. 9 in accordance with some embodiments.
Figure 10B:
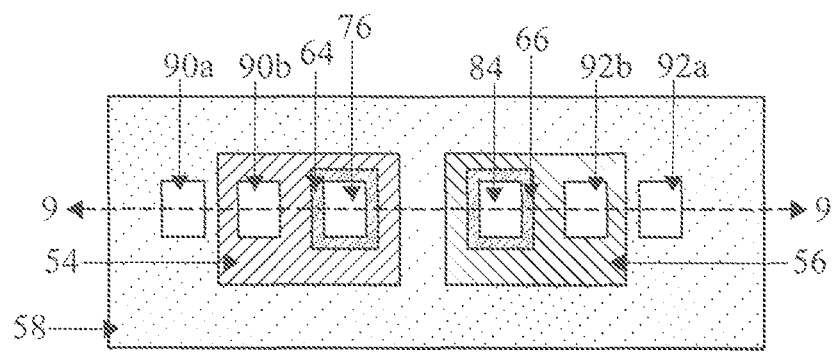
Figure 10C:
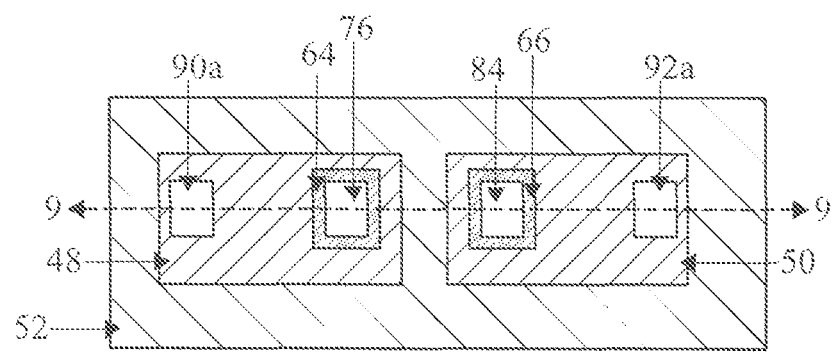
Figure 11:
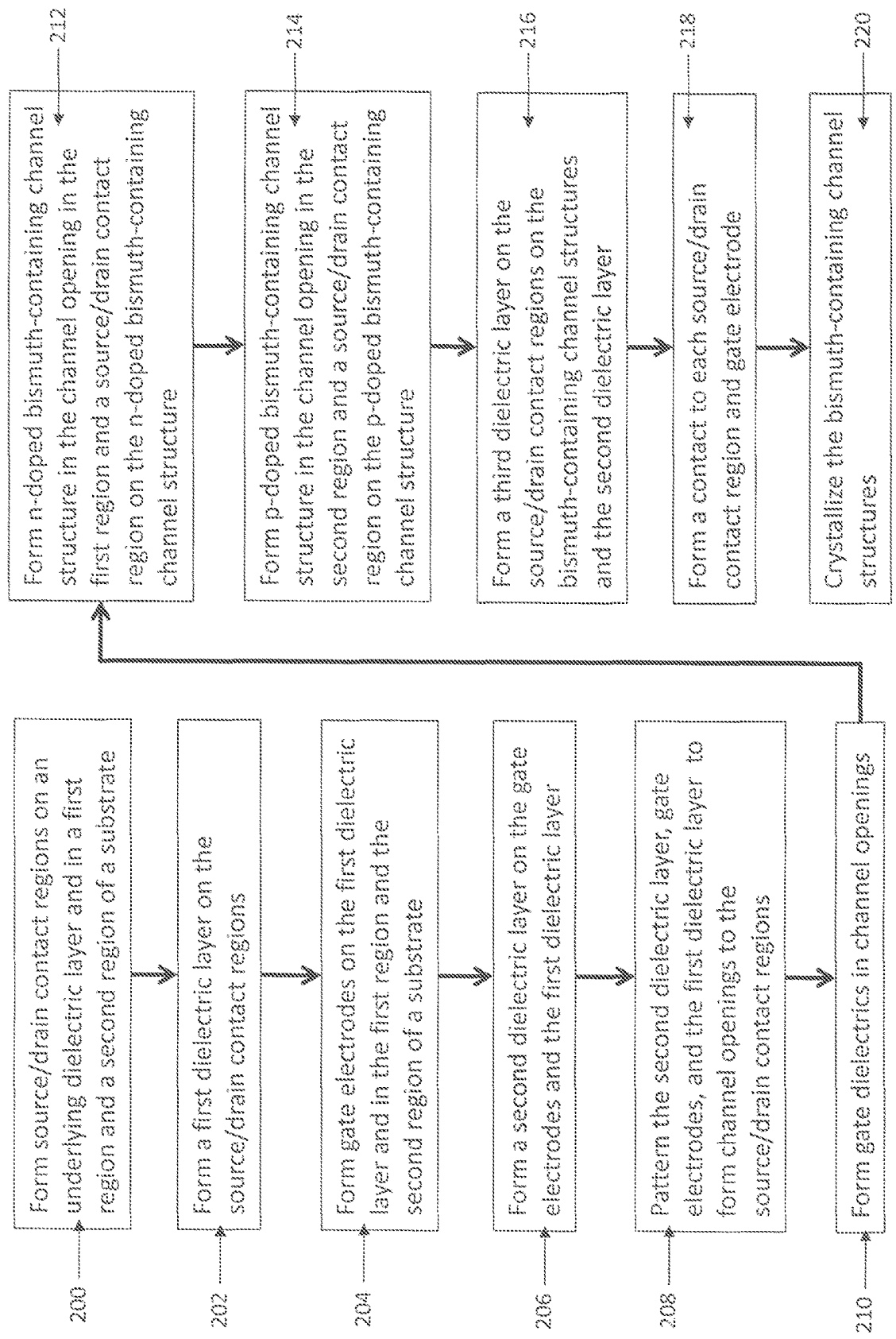
FIG. 11 is a flow chart of the process of FIGS. 1 through 9 in accordance with some embodiments.

FIGS. 1 through 9 illustrate cross sectional views of intermediate stages of manufacturing a complementary transistor structure in accordance with some embodiments. FIGS. 10A through 10C illustrate overlaid layout views of the structure in FIG. 9. FIG. 11 is a flow chart of the process illustrated and described with respect to FIGS. 1 through 9. The steps shown in Figure ii will be described in the context of FIGS. 1 through 9.

Figure 1:
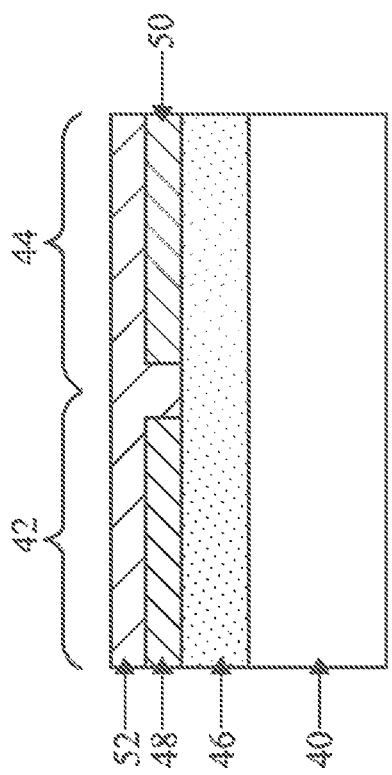

FIG. 1 illustrates a substrate 40 with a first region 42 and a second region 44, an underlying dielectric layer 46 on the substrate 40, source/drain contact regions 48 and 50 on the underlying dielectric layer 46, and a first dielectric layer 52 on the source/drain contact regions 48 and 50 and the underlying dielectric layer 46. The substrate 40 can be any appropriate support structure, and can include a semiconductor substrate. In some embodiments, the substrate 40 is a semiconductor substrate, and in other embodiments, the substrate 40 includes a semiconductor substrate with various dielectric layers, e.g., inter-layer dielectric (ILD) layers and/or inter-metallization dielectric (IMD) layers, thereon. Some examples will be explained in more detail with reference to subsequent figures. A semiconductor substrate can be a bulk semiconductor substrate, a semiconductor-on-insulator (SOI) substrate, multi-layered or gradient substrates, or the like. The semiconductor of the semiconductor substrate may include any semiconductor material, such as elemental semiconductor like silicon, germanium, or the like; a compound or alloy semiconductor including SiC, GaAs, GaP, InP, InAs, indium antimonide, SiGe, GaAsP, AlInAs, AlGaAs, GaInAs, GaInP, and/or GaInAsP; the like; or combinations thereof. The semiconductor substrate may further be a wafer, for example. The first region 42 can be for the formation of a first type of device, such as an n-channel transistor, and the second region 44 can be for the formation of a second, e.g., complementary, type of device, such as a p-channel transistor.

The underlying dielectric layer 46 is formed over and on the substrate 40. The underlying dielectric layer 46 can be formed by an appropriate deposition technique, such as Chemical Vapor Deposition (CVD), Plasma Enhanced CVD (PECVD), spin-on, the like, or a combination thereof, or an appropriate growth technique, such as thermal oxidation, the like, or a combination thereof, and can be formed of a dielectric material such as silicon oxide, Phospho-Silicate Glass (PSG), Boro-Silicate Glass (BSG), Boron-Doped Phospho-Silicate Glass (BPSG), undoped Silicate Glass (USG), a nitride, oxynitride, or the like. A Chemical Mechanical Polish (CMP) may be performed to planarize the underlying dielectric layer 46.

In FIG. 1 and in step 200 of Figure ii, the source/drain contact regions 48 and 50 are formed over and on the underlying dielectric layer 46. The source/drain contact region 48 is formed in the first region 42, and the source/drain contact region 50 is formed in the second region 44. The source/drain contact regions 48 and 50 can be any acceptable conductive material, and some embodiments contemplate that the source/drain contact regions 48 and 50 each are metal, a metal-semiconductor compound, the like, or a combination thereof. Example metals include copper, gold, cobalt, titanium, aluminum, nickel, tungsten, titanium nitride (TiN), or the like. Example metal-semiconductor compounds include nickel silicide (NiSi), titanium silicide (TiSi), tungsten silicide (WSi), cobalt silicide (CoSi), titanium germanide (TiGe), NiSiGe, NiGe, or the like. The source/drain contact regions 48 and 50 can be formed by depositing a layer of conductive material on the underlying dielectric layer 46 and subsequently patterning the layer of conductive material into the source/drain contact regions 48 and 50. In some embodiments where the conductive material is metal, the metal can be deposited on the underlying dielectric layer 46 by Physical Vapor Deposition (PVD), Atomic Layer Deposition (ALD), CVD, the like, or a combination thereof. In some embodiments where the conductive material is a metal-semiconductor compound, a semiconductor material, such as silicon like polysilicon, polygermanium, or the like, can be deposited on the underlying dielectric layer 46 by CVD, PECVD, Low-Pressure CVD (LPCVD), evaporation, the like, or a combination thereof, and a metal can be deposited, such as discussed above, on the semiconductor material. An anneal can then be performed to react the semiconductor material with the metal to form the semiconductor-metal compound. The patterning may use an acceptable photolithography and etching process, such as Reactive Ion Etching (RIE), chemical etching, or the like. Other patterning techniques may be used. In the illustration, the source/drain contact region 48 is separate from and not electrically coupled to the source/drain contact regions 50. In other embodiments, the source/drain contact regions 48 and 50 may be a same conductive region and may be electrically coupled together.

Continuing in FIG. 1 and in step 202 of FIG. 11, the first dielectric layer 52 is formed over and on the source/drain contact regions 48 and 50 and the underlying dielectric layer 46. The first dielectric layer 52 can be formed by an appropriate deposition technique, such as CVD, PECVD, spin-on, the like, or a combination thereof, and can be formed of a dielectric material such as silicon oxide, PSG, BSG, BPSG, USG, a nitride, oxynitride, or the like. A CMP may be performed to planarize the first dielectric layer 52.

In FIG. 2 and step 204 of FIG. 11, gate electrodes 54 and 56 are formed on the first dielectric layer 52 and in the first region 42 and the second region 44. The gate electrode 54 is formed in the first region 42 and directly above at least a portion of the source/drain contact region 48, and the gate electrode 56 is formed in the second region 44 and directly above at least a portion of the source/drain contact region 50. The gate electrodes 54 and 56 can be any acceptable conductive material, such as a metal-containing material, a metal-semiconductor compound, doped semiconductor, or the like. In the illustration, the gate electrodes 54 and 56 are a metal-containing material, such as TiN, TaN, TaC, Co, Ru, Al, W, the like, or a combination thereof. The gate electrodes 54 and 56 can be formed by depositing a layer of conductive material on the first dielectric layer 52 and subsequently patterning the layer of conductive material into the gate electrodes 54 and 56. In the illustration, the metal-containing material can be deposited on the first dielectric layer 52 by PVD, ALD, CVD, the like, or a combination thereof. The patterning may use an acceptable photolithography and etching process, such as RIE or the like. Other patterning techniques may be used. In other embodiments, the gate electrodes 54 and 56 are a doped semiconductor material, such as an n-doped polysilicon or a p-doped polysilicon.

Further in FIG. 2 and step 206 of FIG. 11, a second dielectric layer 58 is formed on the gate electrodes 54 and 56 and the first dielectric layer 52. The second dielectric layer 58 can be formed by an appropriate deposition technique, such as CVD, PECVD, spin-on, the like, or a combination thereof, and can be formed of a dielectric material such as silicon oxide, PSG, BSG, BPSG, USG, nitride, oxynitride, or the like. A CMP may be performed to planarize the second dielectric layer 58.

Figure 3:
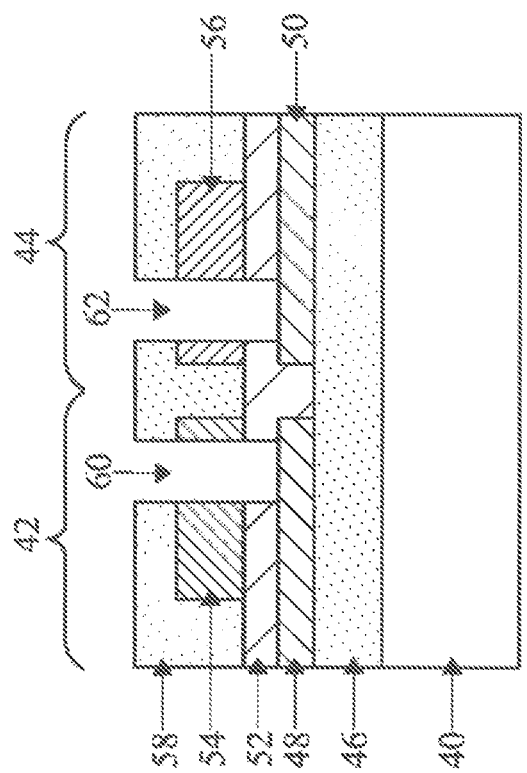

In FIG. 3 and step 208 of FIG. 11, the second dielectric layer 58, the gate electrodes 54 and 56, and the first dielectric layer 52 are patterned to form channel openings 60 and 62. Channel opening 60 is formed through the second dielectric layer 58, the gate electrode 54, and the first dielectric layer 52 to the source/drain contact region 48 in the first region 42. At least a portion of the source/drain contact region 48 is exposed by the channel opening 60. Channel opening 62 is formed through the second dielectric layer 58, the gate electrode 56, and the first dielectric layer 52 to the source/drain contact region 50 in the second region 44. At least a portion of the source/drain contact region 50 is exposed by the channel opening 62. The channel openings 60 and 62 may be formed by using an acceptable photolithography and etching process, such as RIE, isotropic plasma etching, or the like.

Figure 4:
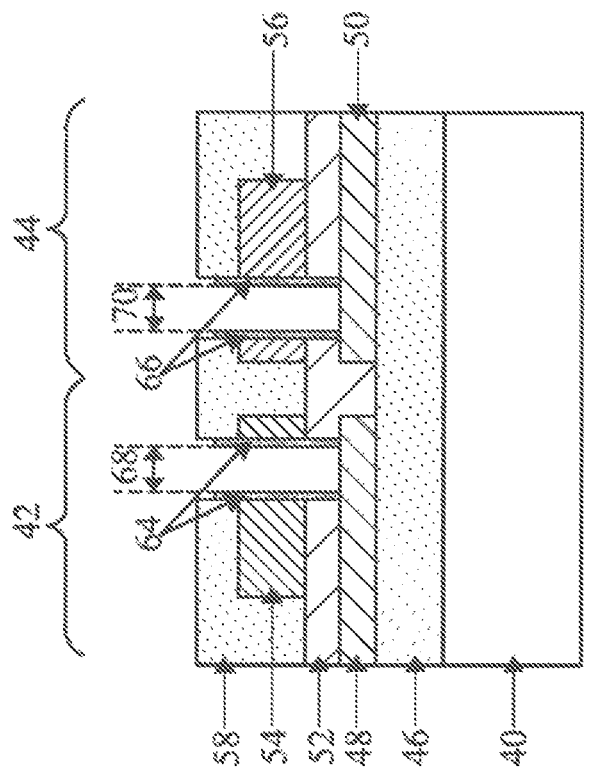

In FIG. 4 and step 210 of FIG. 11, gate dielectrics 64 and 66 are formed in the channel openings 60 and 62, respectively. In some embodiments, gate dielectrics 64 and 66 each comprise silicon oxide, silicon nitride, or multilayers thereof. In other embodiments, gate dielectrics 64 and 66 each comprise a high-k dielectric material, and in these embodiments, gate dielectrics 64 and 66 may have a k value greater than about 7.0, and may include a metal oxide or a silicate of Hf, Al, Zr, La, Mg, Ba, Ti, Zr, Lu, and combinations thereof. A layer of the gate dielectrics 64 and 66 may be deposited by Molecular-Beam Deposition (MBD), ALD, PECVD, the like, or a combination thereof. An appropriate etching process, such as an anisotropic etch like plasma etching, RIE, or the like, can be used to remove substantially horizontal portions of the layer of the gate dielectrics 64 and 66 such that vertical portions of the layer of the gate dielectrics 64 and 66 remain in the channel openings 60 and 62 to form the gate dielectrics 64 and 66 along the sidewalls of the channel openings 60 and 62, respectively. After the horizontal portions of the layer of the gate dielectrics 64 and 66 are removed, at least respective portions of the source/drain contact regions 48 and 50 are exposed through the channel openings 60 and 62.

Dimensions 68 and 70 result between opposing inner sidewalls of the gate dielectrics 64 and 66 in the channel openings 60 and 62, respectively. The dimensions 68 and 70 can cause a material that would be a semimetal material in bulk to transition to a semiconductor material when formed in the channel openings 60 and 62, as will be discussed in further detail below.

Figure 6:
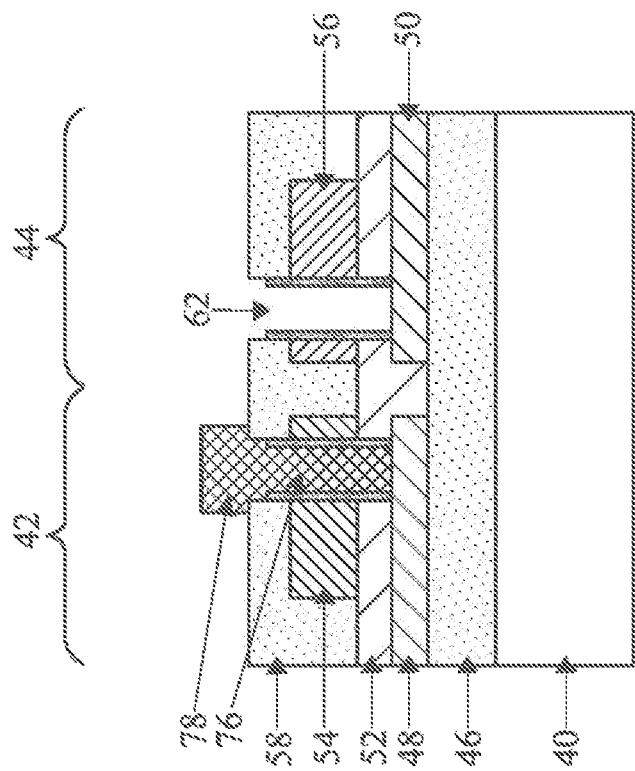
Figure 5:
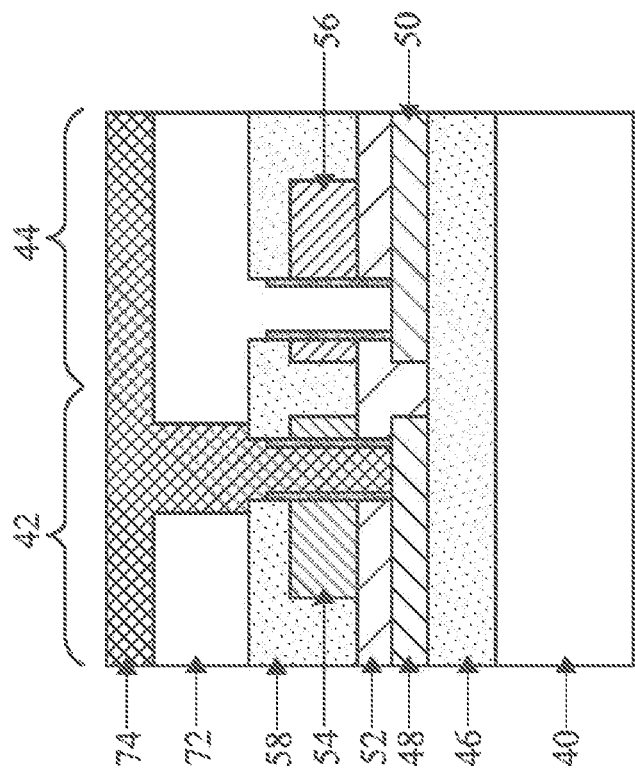

In FIGS. 5 and 6 and step 212 of FIG. 11, an n-doped bismuth-containing channel structure 76 is formed in the channel opening 60 in the first region 42, and a source/drain contact region 78 is formed on the n-doped bismuth-containing channel structure 76. In FIG. 5, a mask layer 72, such as a hardmask, is deposited on the second dielectric layer 58 and in the channel openings 60 and 62. The mask layer 72 is patterned to expose the channel opening 60 in the first region 42. The mask layer 72 may be formed of, for example, silicon nitride, silicon carbide, silicon oxynitride, silicon carbon nitride, or the like, and may be formed using CVD, PECVD, ALD, or the like. The patterning may use an acceptable photolithography and etching process, such as RIE or the like. An opening through the mask layer 72 that exposes the channel opening 60 may have a larger lateral dimension than a corresponding lateral dimension of the channel opening 60.

An n-doped bismuth-containing material 74 is then deposited in the channel opening 60 in the first region 42 while being prevented from being deposited in the channel opening 62 in the second region due to the mask layer 72. Example bismuth-containing material includes bismuth (Bi), doped bismuth, or the like. An example n-type dopant in bismuth material is tellurium (Te). The bismuth-containing material 74 can be deposited by ALD, CVD, the like, or a combination thereof. The bismuth-containing material 74 can be doped with an n-type dopant during deposition of the bismuth-containing material 74, e.g., in situ. A concentration of the n-type dopant in the bismuth-containing material 74 can be in a range from about $1\times10^{17}$ cm$^{-3}$ to about $5\times10^{20}$ cm$^{-3}$. As an example, bismuth (Bi) can be deposited using ALD or CVD using one or more of the following precursor gases: Bis(acetate-O)triphenylbismuth(V) (($CH_3CO_2$)$_2$Bi($C_6H_5$)$_3$), Triphenylbismuth (Bi($C_6H_5$)$_3$), and Tris(2-methoxyphenyl)bismuthine (($CH_3OC_6H_4$)$_3$Bi). As an example, tellurium (Te) can be in situ doped during the deposition of a bismuth-containing material using one or more of the following precursor gases: Tellurium tetrabromide anhydrous (TeBr$_4$) and Tellurium tetrachloride (TeCl$_4$).

In FIG. 6, excess bismuth-containing material 74 and the mask layer 72 are removed. Excess bismuth-containing material 74 can be removed using an acceptable planarization process, such as a CMP. The planarization process can remove the excess bismuth-containing material 74 and/or the mask layer 72 until a source/drain contact region 78 formed from the n-doped bismuth-containing material 74 extends an appropriate height above the second dielectric layer 58. After the planarization process, remaining portions of the mask layer 72 can be removed using an acceptable etch, such as a wet etch selective to the material of the mask layer 72. In addition to the source/drain contact region 78 formed from the n-doped bismuth-containing material 74, the remaining portion of the n-doped bismuth-containing material 74 in the channel opening 60 forms the n-doped bismuth-containing channel structure 76 in the first region 42. The n-doped bismuth-containing channel structure 76 is connected to the source/drain contact region 48 in the first region 42.

Figure 8:
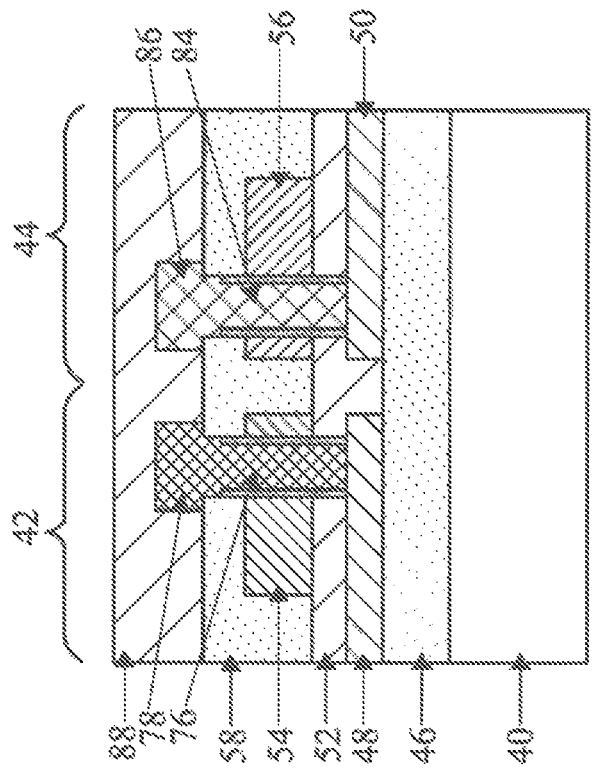
Figure 7:
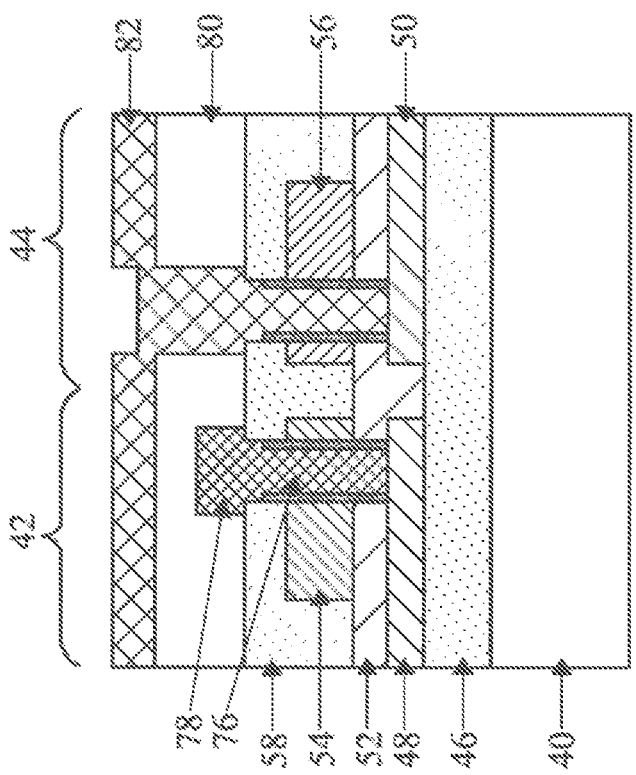

In FIGS. 7 and 8 and step 214 of FIG. 11, a p-doped bismuth-containing channel structure 84 is formed in the channel opening 62 in the second region 44, and a source/drain contact region 86 is formed on the p-doped bismuth-containing channel structure 84. In FIG. 7, a mask layer 80, such as a hardmask, is deposited on the second dielectric layer 58, on the source/drain contact region 78, and in the channel opening 62. The mask layer 80 is patterned to expose the channel opening 62 in the second region 44. The mask layer 80 may be formed of, for example, silicon nitride, silicon carbide, silicon oxynitride, silicon carbon nitride, or the like, and may be formed using CVD, PECVD, ALD, or the like. The patterning may use an acceptable photolithography and etching process, such as RIE or the like. An opening through the mask layer 80 that exposes the channel opening 62 may have a larger lateral dimension than a corresponding lateral dimension of the channel opening 62.

A p-doped bismuth-containing material 82 is then deposited in the channel opening 62 in the second region 44. Example bismuth-containing material includes bismuth (Bi), doped bismuth, or the like. An example p-type dopant in bismuth material is tin (Sn). The bismuth-containing material 82 can be deposited by ALD, CVD, the like, or a combination thereof. The bismuth-containing material 82 can be doped with a p-type dopant during deposition of the bismuth-containing material 82, e.g., in situ. A concentration of the p-type dopant in the bismuth-containing material 82 can be in a range from about $1 \times 10^{17}$ cm$^{-3}$ to about $5 \times 10^{20}$ cm$^{-3}$. As an example, bismuth (Bi) can be deposited using ALD or CVD using one or more of the following precursor gases: Bis(acetate-O)triphenylbismuth(V) (($CH_3CO_2)_2Bi(C_6H_5)_3$), Triphenylbismuth ($Bi(C_6H_5)_3$), and Tris(2-methoxyphenyl)bismuthine (($CH_3OC_6H_4)_3Bi$). As an example, tin (Sn) can be in situ doped during the deposition of a bismuth-containing material using one or more of the following precursor gases: $SnH_4$, $SnH_3Cl$, $SnH_2Cl_2$, $SnHCl_3$, $SnH_3$, $SnH_2Cl$, $SnHCl_2$, $SnH_2$, $HSnCl$, $SnH$, $SnCl_4$, $SnCl_3$, $SnCl_2$, and $SnCl$.

In FIG. 8, excess bismuth-containing material 82 and the mask layer 80 are removed. Excess bismuth-containing material 82 can be removed using an acceptable planarization process, such as a CMP. The planarization process can remove the excess bismuth-containing material 82 and/or the mask layer 80 until a source/drain contact region 86 formed from the p-doped bismuth-containing material 82 extends an appropriate height above the second dielectric layer 58. After the planarization process, remaining portions of the mask layer 80 can be removed using an acceptable etch, such as a wet etch selective to the material of the mask layer 80. In addition to the source/drain contact region 86 formed from the p-doped bismuth-containing material 82, the remaining portion of the p-doped bismuth-containing material 82 in the channel opening 62 forms the p-doped bismuth-containing channel structure 84 in the second region 44. The p-doped bismuth-containing channel structure 84 is connected to the source/drain contact region 50 in the second region 44.

Although the process described with respect to FIGS. 5 through 8 are described in a particular order, the p-doped bismuth-containing channel structure 84 may be formed before the n-doped bismuth-containing channel structure 76, for example. For example, step 214 can be performed before 212 in FIG. 11.

Further in FIG. 8 and in step 216 of FIG. 11, a third dielectric layer 88 is formed on the source/drain contact regions 78 and 86 and the second dielectric layer 58. The third dielectric layer 88 can be formed by an appropriate deposition technique, such as CVD, PECVD, spin-on, the like, or a combination thereof, and can be formed of a dielectric material such as silicon oxide, PSG, BSG, BPSG, USG, nitride, oxynitride, or the like. A CMP may be performed to planarize the third dielectric layer 88.

Figure 9:
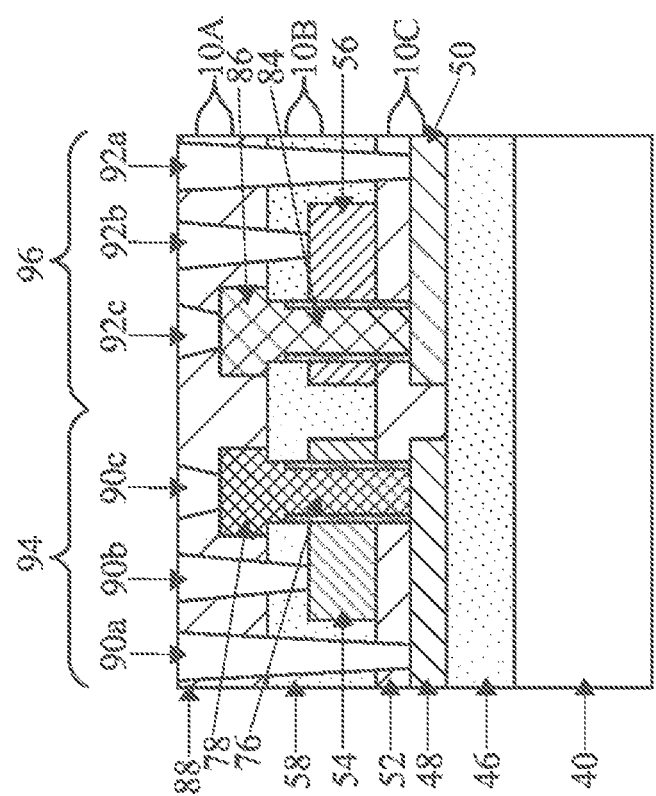

In FIG. 9 and step 218 of FIG. 11, contacts 90a, 90b, 90c, 92a, 92b, and 92c are formed to respective components in an n-channel transistor 94 and a p-channel transistor 96. Openings for contacts 90a, 90b, 90c, 92a, 92b, and 92c are formed through respective ones of the third dielectric layer 88, second dielectric layer 58, and first dielectric layer 52. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the third dielectric layer 88. The remaining liner and conductive material form contacts 90a, 90b, 90c, 92a, 92b, and 92c in the openings. Contact 90a is physically and electrically coupled to the source/drain contact region 48 in the first region 42. Contact 90b is physically and electrically coupled to the gate electrode 54 in the first region 42. Contact 90c is physically and electrically coupled to the source/drain contact region 78 in the first region 42. Contact 92a is physically and electrically coupled to the source/drain contact region 50 in the second region 44. Contact 92b is physically and electrically coupled to the gate electrode 56 in the second region 44. Contact 92c is physically and electrically coupled to the source/drain contact region 86 in the second region 44. Contacts 90a and 92a may each be a source contact. Contacts 90b and 92b may each be a gate contact. Contacts 90c and 92c may each be a drain contact.

In step 220 of FIG. 11 and after the contacts 90a, 90b, 90c, 92a, 92b, and 92c are formed, the structure of FIG. 9 can be annealed to crystallize the bismuth-containing material in the structure, including the n-doped bismuth-containing channel structure 76 and the p-doped bismuth-containing channel structure 84. The anneal can be a low temperature anneal since the melting point of bismuth is low, e.g., 271.4° C., for crystallization. In some embodiments, the low temperature anneal is performed at a temperature of 400° C. or less, such as 300° C. or less, and more particularly at 275° C., for a duration in a range from about 0.01 seconds to about 300 seconds.

FIG. 9 further illustrates regions 10A, 10B, and 10C that are illustrated in overlaid layouts in FIGS. 10A, 10B, and 10C, respectively. The layout FIGS. 10A, 10B, and 10C illustrate in further detail components in FIG. 9. As can be seen in FIG. 10B, the gate electrodes 54 and 56 wrap around the n-doped bismuth-containing channel structure 76 and the p-doped bismuth-containing channel structure 84, respectively. The transistors 94 and 96 may therefore be referred to as vertical channel, all-around gate devices. FIGS. 10A, 10B, and 10C further illustrate a cross section 9-9 shown in FIG. 9.

Figure 12A:
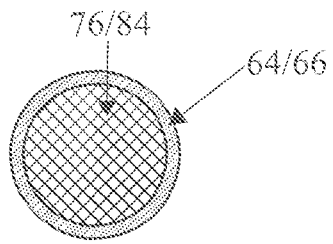
FIGS. 12A through 12H are example cross sections of bismuth-containing channel structures and corresponding gate dielectrics in accordance with some embodiments.
Figure 12B:
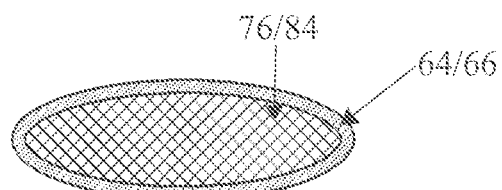
Figure 12C:
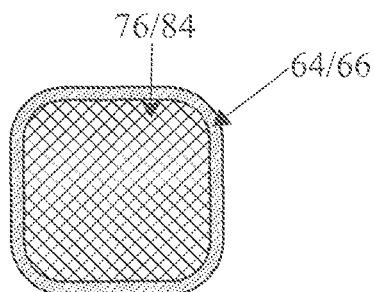
Figure 12D:
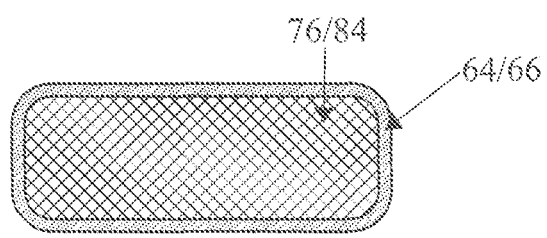
Figure 12E:
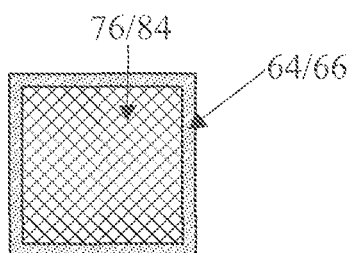
Figure 12F:
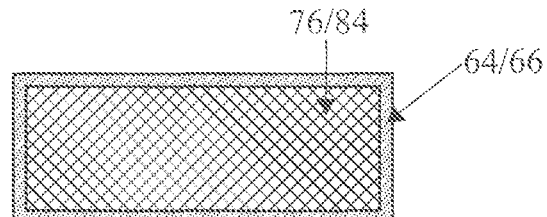
Figure 12G:
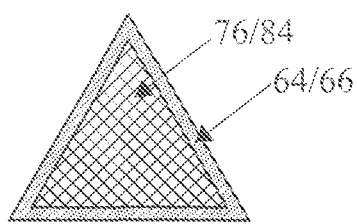
Figure 12H:
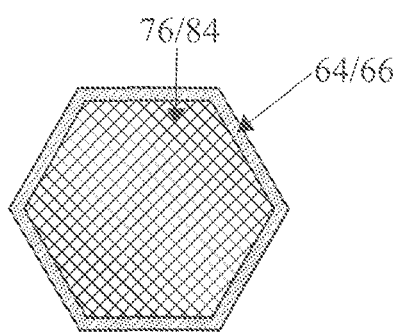

FIGS. 12A through 12H illustrate example cross sections that the n-doped bismuth-containing channel structure 76 and/or the p-doped bismuth-containing channel structure 84 (referenced as "channel structures 76/84") and the gate dielectrics 64 and/or 66 (referenced as "gate dielectrics 64/66"), respectively, can have, such as in FIGS. 10B and 10C. In FIG. 12A, the channel structures 76/84 can have a circular cross section with the gate dielectrics 64/66 outlining the cross section. In FIG. 12B, the channel structures 76/84 can have an elliptical cross section with the gate dielectrics 64/66 outlining the cross section. In FIG. 12C, the channel structures 76/84 can have a rounded-corner square cross section with the gate dielectrics 64/66 outlining the cross section. In FIG. 12D, the channel structures 76/84 can have a rounded-corner rectangular cross section with the gate dielectrics 64/66 outlining the cross section. In FIG. 12E, the channel structures 76/84 can have a square cross section with the gate dielectrics 64/66 outlining the cross section. In FIG. 12F, the channel structures 76/84 can have a rectangular cross section with the gate dielectrics 64/66 outlining the cross section. In FIG. 12G, the channel structures 76/84 can have a triangular cross section with the gate dielectrics 64/66 outlining the cross section. In FIG. 12H, the channel structures 76/84 can have a hexagonal cross section with the gate dielectrics 64/66 outlining the cross section. The channel structures 76/84 can have other cross sections. The cross sections can be formed by the formation of the channel openings 60 and 62, as one of ordinary skill in the art will readily understand.

Figure 13:
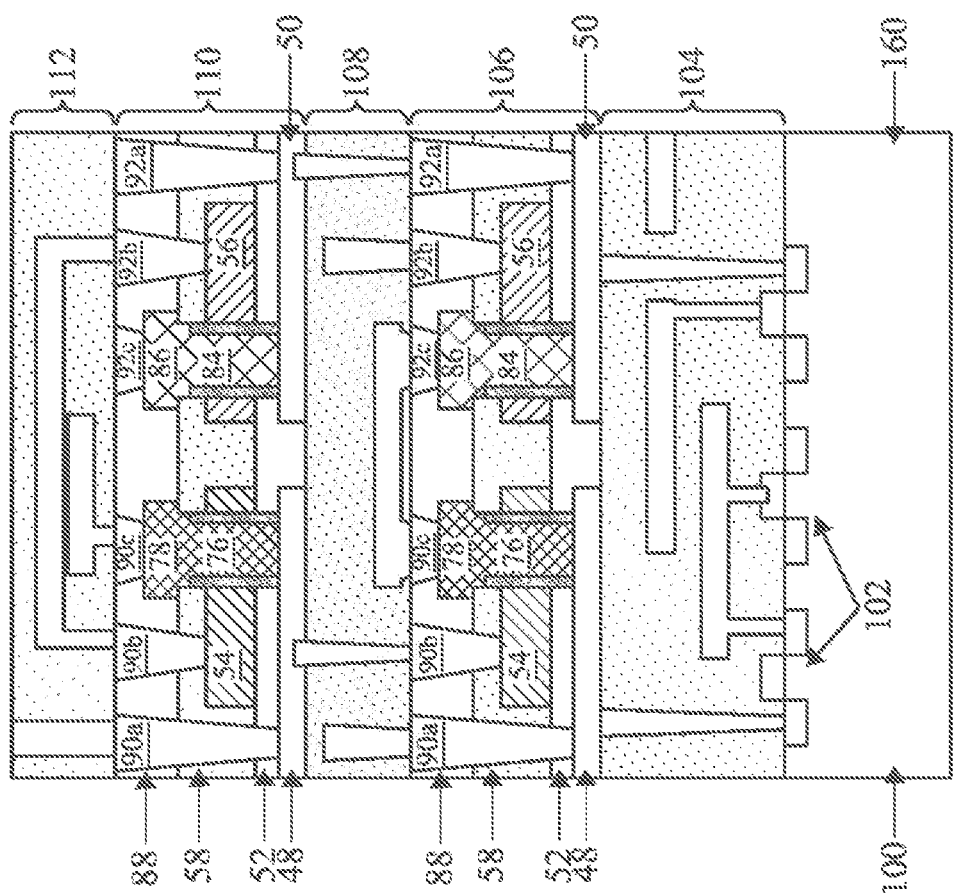
FIG. 13 is a structure vertically integrating some aspects of the embodiment of FIGS. 1 through 9 in accordance with some embodiments.
Figure 14:
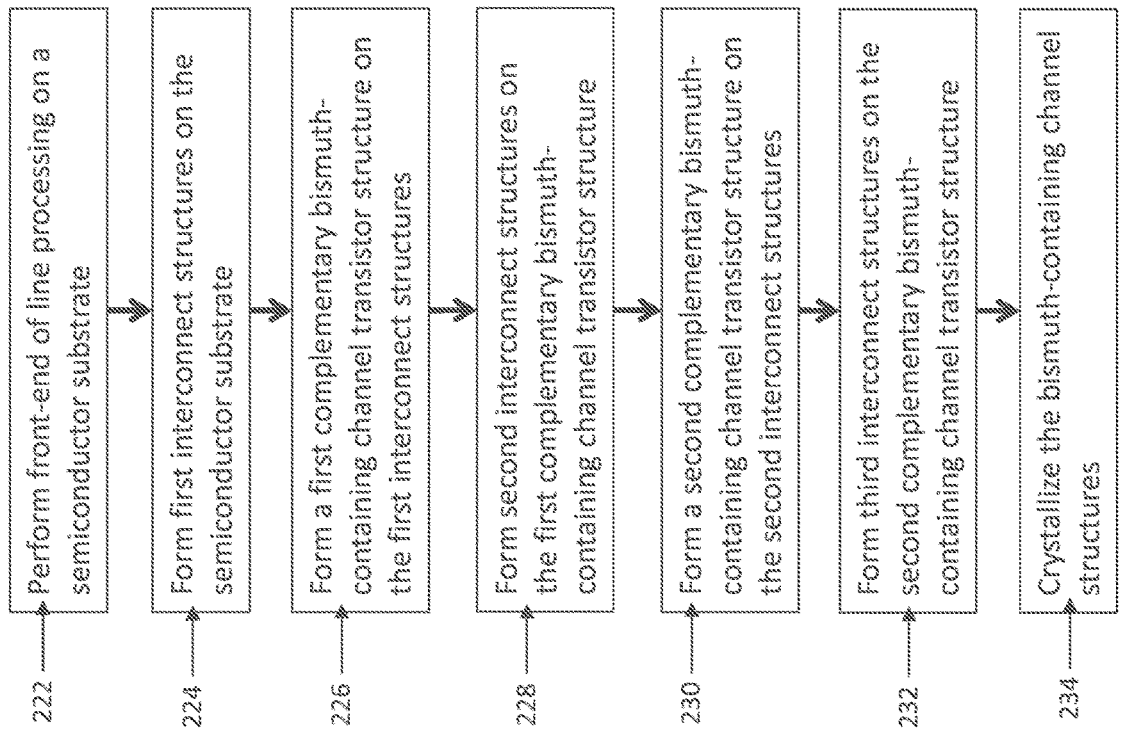
FIG. 14 is a flow chart of a process to manufacture the structure of FIG. 13 in accordance with some embodiments.

FIG. 13 illustrates vertical integration of aspects of the embodiment of FIGS. 1 through 9 in accordance with some embodiments. FIG. 14 is a flow chart of a process described with respect to FIG. 13. The steps shown in FIG. 14 will be described in the context of FIG. 13.

In FIG. 13 and in step 222 of FIG. 14, a semiconductor substrate 100 undergoes front-end of line (FEOL) processing. The semiconductor substrate 100 can be a bulk semiconductor substrate, an active layer of a semiconductor-on-insulator (SOI) substrate, a multi-layered or gradient substrate, or the like. The semiconductor material of the semiconductor substrate 100 can be an elemental semiconductor, such as silicon, germanium, or the like; a compound or allow semiconductor including silicon carbide, gallium arsenic, gallium phosphide, indium phosphide, indium arsenide, indium antimonide, SiGe, GaAsP, AlInAs, AlGaAs, GaInAs, GaInP, and/or GaInAsP; or combinations thereof. The FEOL process can form devices 102, such as transistors, diodes, capacitors, resistors, etc., in and/or on the semiconductor substrate 100. Any acceptable FEOL processing may be used to form such devices 102 for a given application.

Further in FIG. 13 and in step 224 of FIG. 14, first interconnect structures 104 are formed on the semiconductor substrate 100. The first interconnect structures 104 may comprise one or more metallization pattern in one or more dielectric layer on the semiconductor substrate 100. The first interconnect structures 104 may, at least in part, electrically couple the devices 102 together to form an integrated circuit. Any acceptable processing may be used to form such first interconnect structures 104.

Further in FIG. 13 and in step 226 of FIG. 14, a first complementary bismuth-containing channel transistor structure 106 is formed on the first interconnect structures 104. The first transistor structure 106 includes components, and can be formed, as illustrated and discussed with respect to FIGS. 1 through 9 and steps 200 through 218 of FIG. 11. An uppermost dielectric layer of the first interconnect structures 104 can be an underlying dielectric layer 46 discussed in FIGS. 1 through 9. Vias (not numbered) can be formed in the first interconnect structures 104 that are electrically coupled to the source/drain contact regions 48 and 50 in the first transistor structure 106.

Further in FIG. 13 and in step 228 of FIG. 14, second interconnect structures 108 are formed on the first complementary bismuth-containing channel transistor structure 106. The second interconnect structures 108 may comprise one or more metallization pattern in one or more dielectric layer on the first transistor structure 106. The second interconnect structures 108 may be electrically coupled to the n-channel transistor 94 and the p-channel transistor 96 in the first transistor structure 106, such as by vias through one or more dielectric layer of the second interconnect structures 108 to the contacts 90a, 90b, 90c, 92a, 92b, and 92c. Any acceptable processing may be used to form such second interconnect structures 108.

Further in FIG. 13 and in step 230 of FIG. 14, a second complementary bismuth-containing channel transistor structure 110 is formed on the second interconnect structures 108. The second transistor structure 110 includes components, and can be formed, as illustrated and discussed with respect to FIGS. 1 through 9 and steps 200 through 218 of FIG. 11. An uppermost dielectric layer of the second interconnect structures 108 can be an underlying dielectric layer 46 discussed in FIGS. 1 through 9. Vias (not numbered) can be formed in the second interconnect structures 108 that are electrically coupled to the source/drain contact regions 48 and 50 in the second transistor structure 110.

Further in FIG. 13 and in step 232 of FIG. 14, third interconnect structures 112 are formed on the second complementary bismuth-containing channel transistor structure 110. The third interconnect structures 112 may comprise one or more metallization pattern in one or more dielectric layer on the second transistor structure 110. The third interconnect structures 112 may be electrically coupled to the n-channel transistor 94 and the p-channel transistor 96 in the second transistor structure 110, such as by vias through one or more dielectric layer of the third interconnect structures 112 to the contacts 90a, 90b, 90c, 92a, 92b, and 92c. Any acceptable processing may be used to form such third interconnect structures 112.

More or fewer complementary bismuth-containing channel, vertical transistor structures can be vertically integrated in the embodiment illustrated in FIG. 13, such as by repeating or omitting some of the discussed steps. One of ordinary skill in the art will readily understand how to achieve such integration.

In step 234 of FIG. 14, the structure of FIG. 13 can be annealed to crystallize the bismuth-containing material in the complementary bismuth-containing channel transistor structures 106 and 110. The anneal can be a low temperature anneal. In some embodiments, the low temperature anneal is performed at a temperature of 400° C. or less, such as 300° C. or less, and more particularly at 275° C., for a duration in a range from about 0.01 seconds to about 300 seconds. The anneal for multiple complementary bismuth-containing channel transistor structures can be performed once after all of the complementary bismuth-containing channel transistor structures have been formed. Since a bismuth-containing material, such as in the n-doped bismuth-containing channel structure 76 and the p-doped bismuth-containing channel structure 84, generally does not expand in volume when melted, the bismuth-containing material may be fully enclosed while the bismuth-containing material is annealed without a significant risk of causing, e.g., a crack due to the bismuth-containing material. Other embodiments contemplate multiple anneals being performed.

Figure 15:
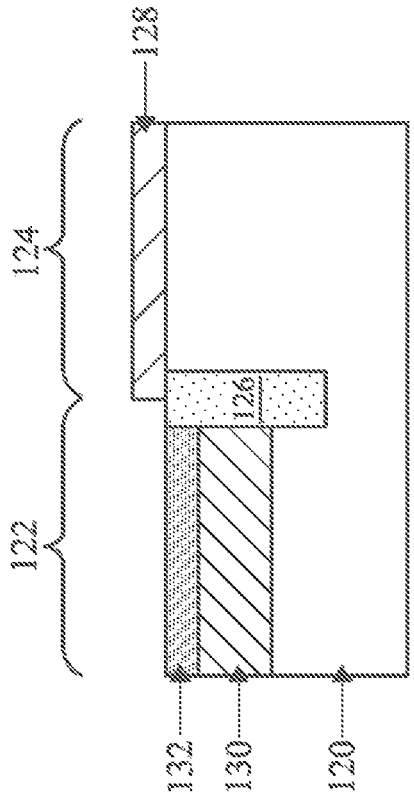
FIGS. 15 through 17 are cross sectional views of intermediate stages of a first manufacturing process to form highly doped source/drain contact regions on a semiconductor substrate in accordance with some embodiments.
Figure 16:
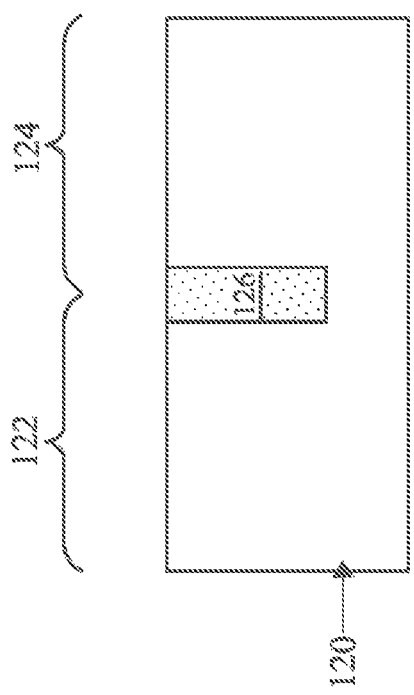
Figure 17:
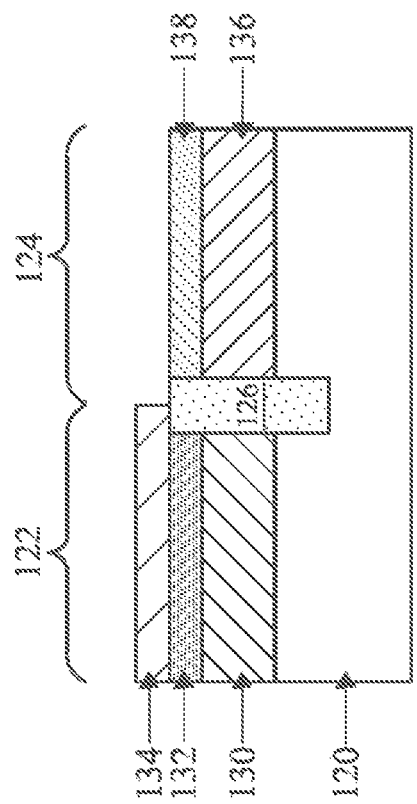
Figure 18:
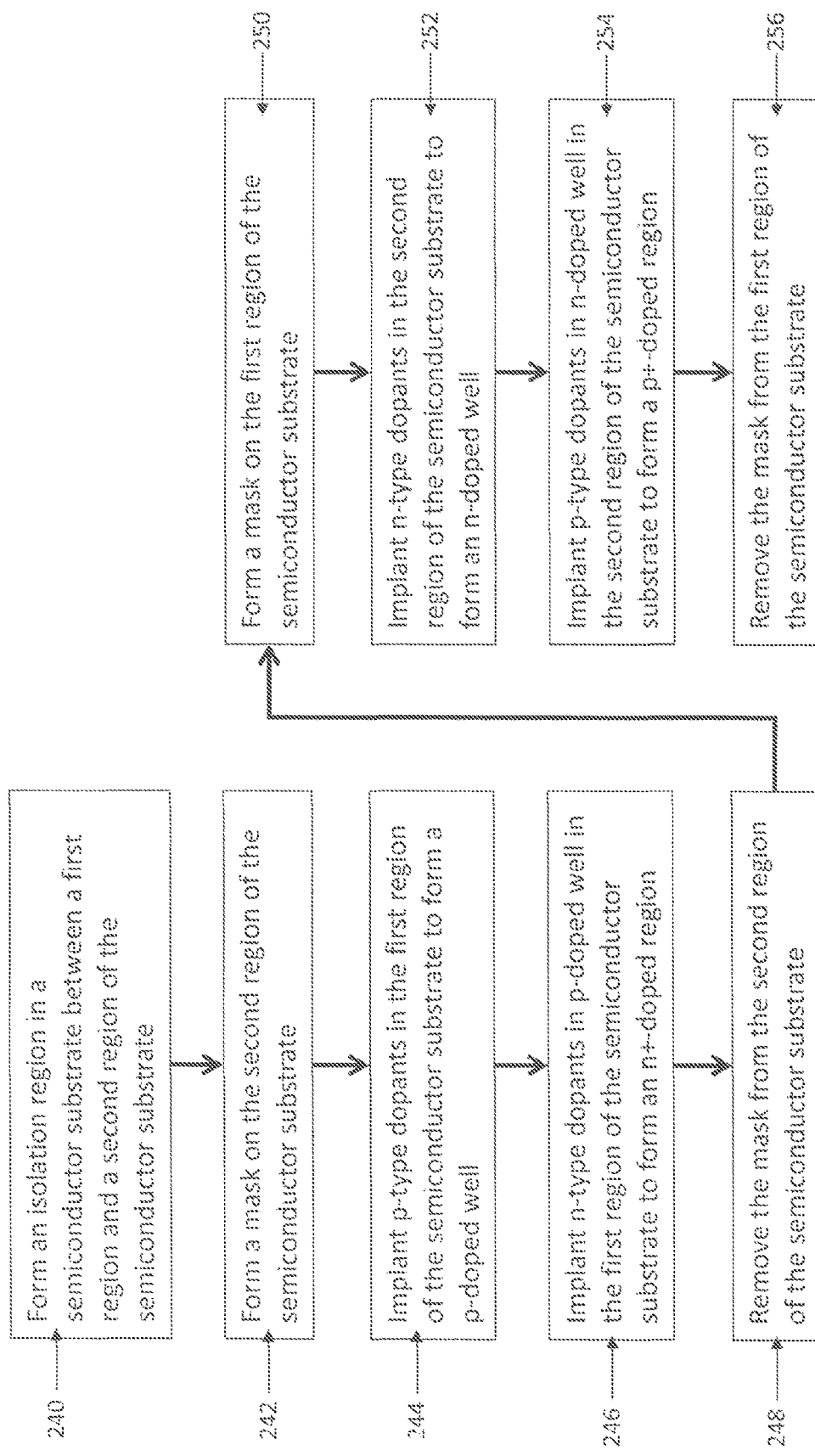
FIG. 18 is a flow chart of the process of FIGS. 15 through 17 in accordance with some embodiments.
Figure 23:
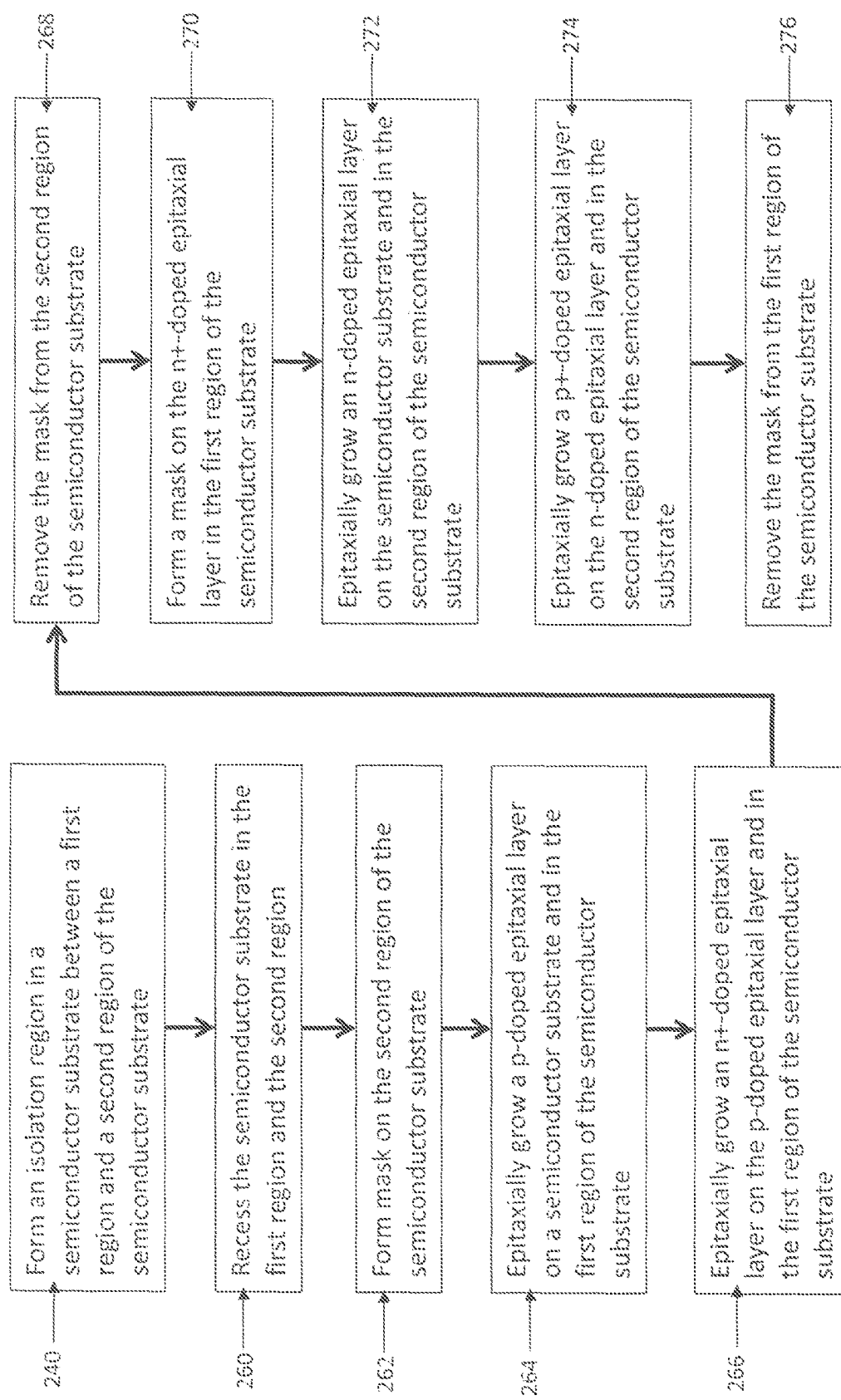
FIG. 23 is a flow chart of the process of FIGS. 19 through 22 in accordance with some embodiments.
Figure 34:
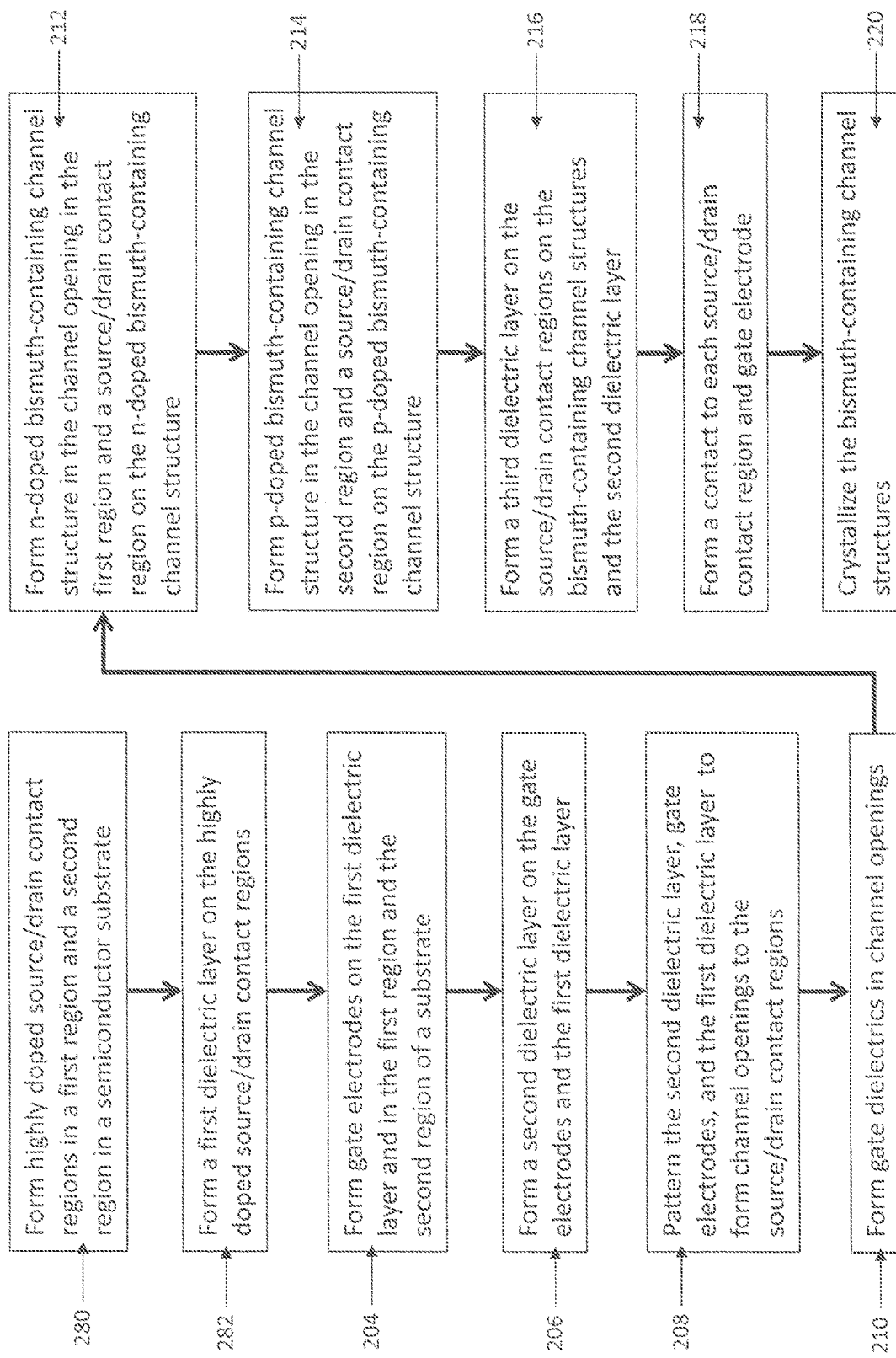
FIG. 34 is a flow chart of the process of FIGS. 24 through 32 in accordance with some embodiments.

FIGS. 15 through 17, 19 through 22, and 24 through 32 illustrate cross sectional views of intermediate stages of manufacturing another complementary transistor structure in accordance with some embodiments. FIGS. 15 through 17 illustrate a first method of forming highly doped source/drain contact regions 162 and 166 on a semiconductor substrate 120. FIG. 18 is a flow chart of the process illustrated and described with respect to FIGS. 15 through 17, and the steps shown in FIG. 18 will be described in the context of FIGS. 15 through 17. FIGS. 19 through 22 illustrate a second method of forming highly doped source/drain contact regions 162 and 166 on a semiconductor substrate 120. FIG. 23 is a flow chart of the process illustrated and described with respect to FIGS. 19 through 22, and the steps shown in FIG. 23 will be described in the context of FIGS. 19 through 22. FIGS. 24 through 32 illustrate a method of forming the complementary transistor structure after the formation of highly doped source/drain contact regions 162 and 166 on a semiconductor substrate 120, such as shown in FIGS. 15 through 17 or 19 through 22. FIG. 34 is a flow chart of the process illustrated and described with respect to FIGS. 24 through 32, and the steps shown in FIG. 34 will be described in the context of FIGS. 24 through 32.

With respect to the process in FIGS. 15 through 18, in FIG. 15 and in step 240 of FIG. 18, an isolation region 126 is formed in a semiconductor substrate 120 between a first region 122 and a second region 124 of the semiconductor substrate 120. The semiconductor substrate 120 can be a bulk semiconductor substrate, a semiconductor-on-insulator (SOI) substrate, multi-layered or gradient substrates, or the like. The semiconductor of the semiconductor substrate 120 may include any semiconductor material, such as elemental semiconductor like silicon, germanium, or the like; a compound or alloy semiconductor including SiC, GaAs, GaP, InP, InAs, indium antimonide, SiGe, GaAsP, AlInAs, AlGaAs, GaInAs, GaInP, and/or GaInAsP; the like; or combinations thereof. The semiconductor substrate 120 may further be a wafer, for example. In some embodiments, the semiconductor substrate 120 is a silicon wafer.

The isolation region 126 is formed extending from a top surface of semiconductor substrate 120 into semiconductor substrate 120. The isolation region 126 may be a Shallow Trench Isolation (STI) region. The formation of the isolation region 126 may include etching the semiconductor substrate 120 to form a trench, and filling the trench with a dielectric material to form the isolation region 126. The isolation region 126 may be formed of silicon oxide deposited by a high density plasma, for example, although other dielectric materials formed according to various techniques may also be used. A planarization process, such as a CMP, may be performed to remove excess dielectric material and form the top surface of the isolation region 126 to be co-planar with the top surface of the semiconductor substrate 120. In other embodiments, the isolation region can be formed by thermal oxidation to grow a dielectric material, such as silicon oxide.

In FIG. 16 and in step 242 of FIG. 18, a mask 128 is formed on the second region 124 of the semiconductor substrate 120. The mask 128 is not on the first region 122 of the semiconductor substrate 120, and the first region 122 is exposed. The mask 128 can be a photoresist that is formed by using a spin-on technique and patterned using acceptable photolithography techniques.

Further in FIG. 16 and in step 244 of FIG. 18, once the mask 128 is formed, a p-type dopant is implanted in the first region 122 of the semiconductor substrate 120 to form a p-doped well 130. Example p-type dopants include boron (B) and $BF_2$. A concentration of a p-type dopant in the p-doped well 130 can be in a range from about $1\times10^{16}$ cm$^{-3}$ to about $1\times10^{18}$ cm$^{-3}$.

Further in FIG. 16 and in step 246 of FIG. 18, an n-type dopant is implanted in the p-doped well 130 in the first region 122 of the semiconductor substrate 120 to form an n+-doped region 132. Example n-type dopants include arsenic (As) and phosphorus (P). A concentration of an n-type dopant in the n+-doped region 132 can be in a range from about $1\times10^{20}$ cm$^{-3}$ to about $1\times10^{21}$ cm$^{-3}$.

In FIG. 17 and in step 248 of FIG. 18, the mask 128 is removed, such as by an acceptable ashing process when the mask 128 is a photoresist. Further in FIG. 17 and in step 250 of FIG. 18, a mask 134 is formed on the first region 122 of the semiconductor substrate 120. The mask 134 is not on the second region 124 of the semiconductor substrate 120, and the second region 124 is exposed. The mask 134 can be a photoresist that is formed by using a spin-on technique and patterned using acceptable photolithography techniques.

Further in FIG. 17 and in step 252 of FIG. 18, once the mask 134 is formed, an n-type dopant is implanted in the second region 124 of the semiconductor substrate 120 to form an n-doped well 136. Example n-type dopants include arsenic (As) and phosphorus (P). A concentration of an n-type dopant in the n-doped well 136 can be in a range from about $1\times10^{16}$ cm$^{-3}$ to about $1\times10^{18}$ cm$^{-3}$.

Further in FIG. 17 and in step 254 of FIG. 18, a p-type dopant is implanted in the n-doped well 136 in the second region 124 of the semiconductor substrate 120 to form a p+-doped region 138. Example p-type dopants include boron (B) and $BF_2$. A concentration of a p-type dopant in the p+-doped region 138 can be in a range from about $1\times10^{20}$ cm$^{-3}$ to about $1\times10^{21}$ cm$^{-3}$. In step 256 of FIG. 18, the mask 134 is removed, such as by an acceptable ashing process when the mask 134 is a photoresist.

With respect to the process in FIGS. 19 through 23, in FIG. 19 and in step 240 of FIG. 23, as in FIG. 15, an isolation region 126 is formed in a semiconductor substrate 120 between a first region 122 and a second region 124 of the semiconductor substrate 120. Further in FIG. 19 and step 260 of FIG. 23, the semiconductor substrate 120 is recessed in the first region 122 and the second region 124. The recessing may be by an acceptable etching process.

In FIG. 20 and step 262 of FIG. 23, a mask 140, such as a hardmask, is formed on the second region 124 of the semiconductor substrate 120. The mask 140 may be formed of, for example, silicon nitride, silicon carbon nitride, silicon oxynitride, silicon oxide, or the like, and may be formed using CVD, PECVD, ALD, or the like. The mask 140 can be patterned to be on the second region 124 and not on the first region 122 using an acceptable photolithography and etching process, such as RIE or the like.

In FIG. 21 and step 264 of FIG. 23, a p-doped epitaxial layer 142 is epitaxially grown on the semiconductor substrate 120 and in the first region 122 of the semiconductor substrate 120. The p-doped epitaxial layer 142 may be epitaxially grown using Metal-Organic CVD (MOCVD), Molecular Beam Epitaxy (MBE), Liquid Phase Epitaxy (LPE), Vapor Phase Epitaxy (VPE), the like, or a combination thereof. The p-doped epitaxial layer 142 may comprise silicon, silicon germanium, silicon carbide, germanium, a III-V compound semiconductor, a II-VI compound semiconductor, or the like. The p-doped epitaxial layer 142 may be doped by in situ doping during epitaxial growth with a p-type dopant, such as boron (B) or $BF_2$, with a concentration of in a range from about $1\times10^{16}$ cm$^{-3}$ to about $1\times10^{18}$ cm$^{-3}$.

Further in FIG. 21 and in step 266 of FIG. 23, an n+-doped epitaxial layer 144 is epitaxially grown on the p-doped epitaxial layer 142 and in the first region 122 of the semiconductor substrate 120. The n+-doped epitaxial layer 144 may be epitaxially grown using MOCVD, MBE, LPE, VPE, the like, or a combination thereof. The n+-doped epitaxial layer 144 may comprise silicon, silicon germanium, silicon carbide, germanium, a III-V compound semiconductor, a II-VI compound semiconductor, or the like. The n+-doped epitaxial layer 144 may be doped by in situ doping during epitaxial growth with an n-type dopant, such as arsenic (As) or phosphorus (P), with a concentration of in a range from about $1\times10^{20}$ cm$^{-3}$ to about $1\times10^{21}$ cm$^{-3}$.

In FIG. 22 and in step 268 of FIG. 23, the mask 140 is removed from the second region 124 of the semiconductor substrate 120. The mask 140 can be removed by an appropriate etch selective to the material of the mask 140. Further in FIG. 22 and in step 270 of FIG. 23, a mask 146, such as a hardmask, is formed on the n+-doped epitaxial layer 144 in the first region 122 of the semiconductor substrate 120. The mask 146 may be formed of, for example, silicon nitride, silicon carbon nitride, silicon oxynitride, silicon oxide, or the like, and may be formed using CVD, PECVD, ALD, or the like. The mask 146 can be patterned to be on the first region 122 and not on the second region 124 using an acceptable photolithography and etching process, such as RIE or the like.

Further in FIG. 22 and in step 272 of FIG. 23, an n-doped epitaxial layer 148 is epitaxially grown on the semiconductor substrate 120 and in the second region 124 of the semiconductor substrate 120. The n-doped epitaxial layer 148 may be epitaxially grown using MOCVD, MBE, LPE, VPE, the like, or a combination thereof. The n-doped epitaxial layer 148 may comprise silicon, silicon germanium, silicon carbide, germanium, a III-V compound semiconductor, a II-VI compound semiconductor, or the like. The n-doped epitaxial layer 148 may be doped by in situ doping during epitaxial growth with an n-type dopant, such as arsenic (As) or phosphorus (P), with a concentration of in a range from about $1\times10^{16}$ cm$^{-3}$ to about $1\times10^{18}$ cm$^{-3}$.

Further in FIG. 22 and in step 274 of FIG. 23, a p+-doped epitaxial layer 150 is epitaxially grown on the n-doped epitaxial layer 148 and in the second region 124 of the semiconductor substrate 120. The p+-doped epitaxial layer 150 may be epitaxially grown using MOCVD, MBE, LPE, VPE, the like, or a combination thereof. The p+-doped epitaxial layer 150 may comprise silicon, silicon germanium, silicon carbide, germanium, a III-V compound semiconductor, a II-VI compound semiconductor, or the like. The p+-doped epitaxial layer 150 may be doped by in situ doping during epitaxial growth with a p-type dopant, such as boron (B) or BF$_2$, with a concentration of in a range from about $1\times10^{20}$ cm$^{-3}$ to about $1\times10^{21}$ cm$^{-3}$.

In step 276 of FIG. 23, the mask 146 is removed from the first region 122 of the semiconductor substrate 120. A planarization process, such as a CMP, may be used to remove the mask 146 and may further planarize the n+-doped epitaxial layer 144 and the p+-doped epitaxial layer 150.

Turning to the process in FIGS. 24 through 32 and 34, in FIG. 24 and in step 280 in FIG. 34, highly doped source/drain contact regions 162 and 166 are formed in a first region 122 and a second region 124 in a semiconductor substrate 120. The highly doped source/drain contact region 162 may be an n+-doped source/drain contact region, which may further be the n+-doped region 132 as formed in FIGS. 15 through 18, the n+-doped epitaxial layer 144 as formed in FIGS. 19 through 23, or the like. The highly doped source/drain contact region 166 may be a p+-doped source/drain contact region, which may further be the p+-doped region 138 as formed in FIGS. 15 through 18, the p+-doped epitaxial layer 150 as formed in FIGS. 19 through 23, or the like. Further, doped regions 160 and 164 doped oppositely from and with a concentration less than the highly doped source/drain contact regions 162 and 166, respectively, may be under the highly doped source/drain contact regions 162 and 166, respectively, in the semiconductor substrate 120. The doped region 160 may be a p-doped region, which may further be the p-doped well 130 as formed in FIGS. 15 through 18, the p-doped epitaxial layer 142 as formed in FIGS. 19 through 23, or the like. The doped region 164 may be an n-doped region, which may further be the n-doped well 136 as formed in FIGS. 15 through 18, the n-doped epitaxial layer 148 as formed in FIGS. 19 through 23, or the like. An isolation region 168 separates the first region 122 from the second region 124, e.g., separates the highly doped source/drain contact regions 162 and 166 in the semiconductor substrate 120. The isolation region 168 may be the isolation region 126 as formed in FIGS. 15 through 23 or the like. The first region 122 can be for the formation of a first type of device, such as an n-channel transistor, and the second region 124 can be for the formation of a second, e.g., complementary, type of device, such as a p-channel transistor.

Continuing in FIG. 24 and in step 204 of FIG. 34, a first dielectric layer 170 is formed over and on the highly doped source/drain contact regions 162 and 166 and the isolation region 168. The first dielectric layer 170 can be formed by an appropriate deposition technique, such as CVD, PECVD, spin-on, the like, or a combination thereof, and can be formed of a dielectric material such as silicon oxide, PSG, BSG, BPSG, USG, a nitride, oxynitride, or the like. A CMP may be performed to planarize the first dielectric layer 170.

Figure 31:
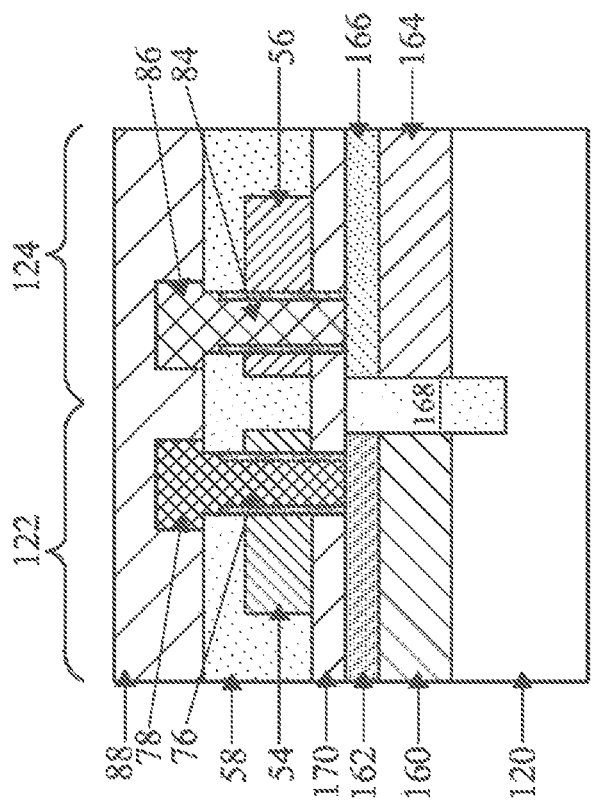
Figure 32:
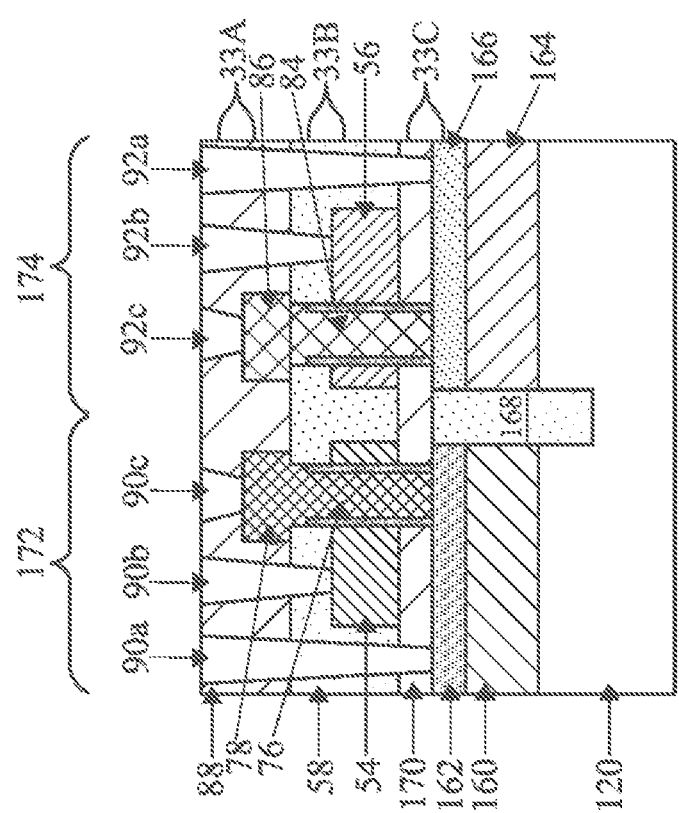

Processes and structures formed in FIGS. 25 through 32 and steps 204 through 220 of FIG. 32 correspond to FIGS. 2 through 9 and steps 204 through 220 of FIG. 11. A brief discussion of FIGS. 25 through 32 and steps 204 through 220 of FIG. 32 is provided below, and additional details were previously discussed with respect to FIGS. 2 through 9 and steps 204 through 220 of FIG. 11.

In FIG. 25 and step 204 of FIG. 34, gate electrodes 54 and 56 are formed on the first dielectric layer 170 and in the first region 122 and the second region 124. The gate electrode 54 is formed in the first region 122 and directly above at least a portion of the highly doped source/drain contact region 162, and the gate electrode 56 is formed in the second region 124 and directly above at least a portion of the highly doped source/drain contact region 166. Further in FIG. 25 and step 206 of FIG. 34, a second dielectric layer 58 is formed on the gate electrodes 54 and 56 and the first dielectric layer 170.

Figure 26:
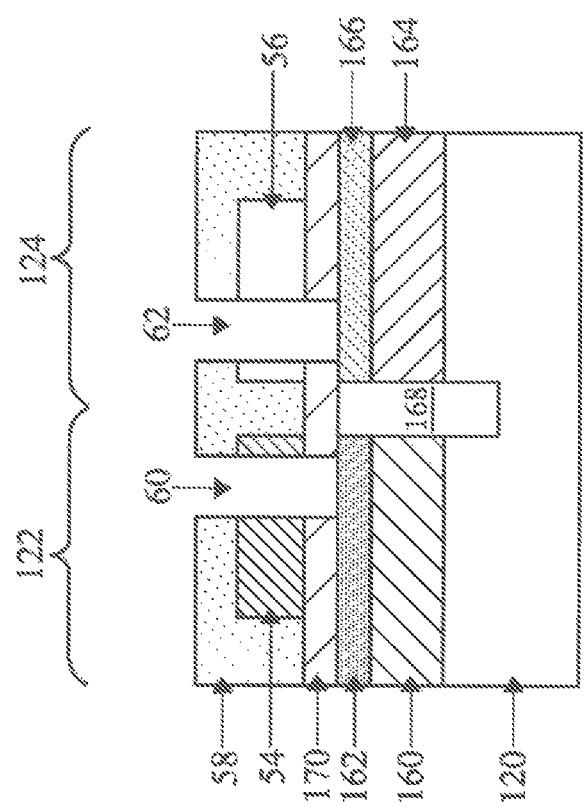

In FIG. 26 and step 208 of FIG. 34, the second dielectric layer 58, the gate electrodes 54 and 56, and the first dielectric layer 170 are patterned to form channel openings 60 and 62. Channel opening 60 is formed through the second dielectric layer 58, the gate electrode 54, and the first dielectric layer 170 to the highly doped source/drain contact region 162 in the first region 122. At least a portion of the highly doped source/drain contact region 162 is exposed by the channel opening 60. Channel opening 62 is formed through the second dielectric layer 58, the gate electrode 56, and the first dielectric layer 170 to the highly doped source/drain contact region 166 in the second region 124. At least a portion of the highly doped source/drain contact region 166 is exposed by the channel opening 62.

Figure 27:
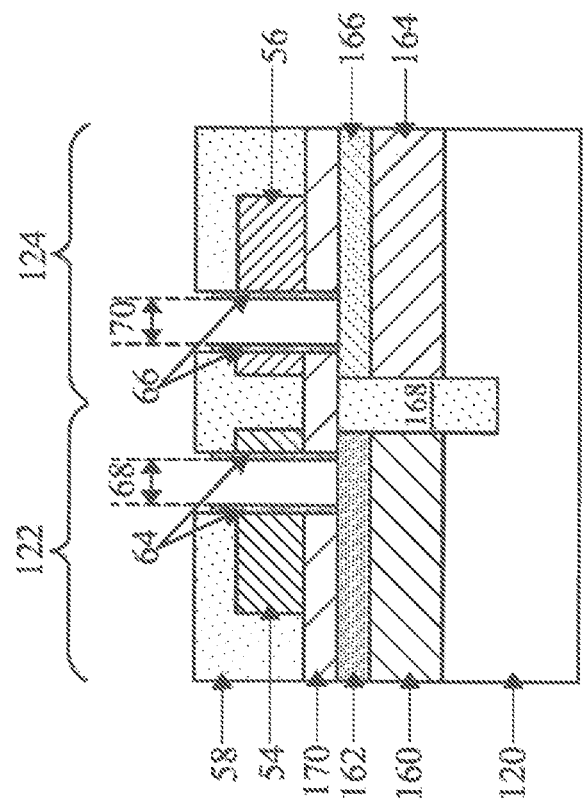

In FIG. 27 and step 210 of FIG. 34, gate dielectrics 64 and 66 are formed in the channel openings 60 and 62, respectively. At least respective portions of the highly doped source/drain contact region 162 and 166 are exposed through the channel openings 60 and 62.

Dimensions 68 and 70 result between opposing inner sidewalls of the gate dielectrics 64 and 66 in the channel openings 60 and 62, respectively. The dimensions 68 and 70 can cause a material that would be a semimetal material in bulk to transition to a semiconductor material when formed in the channel openings 60 and 62, as will be discussed in further detail below.

Figure 29:
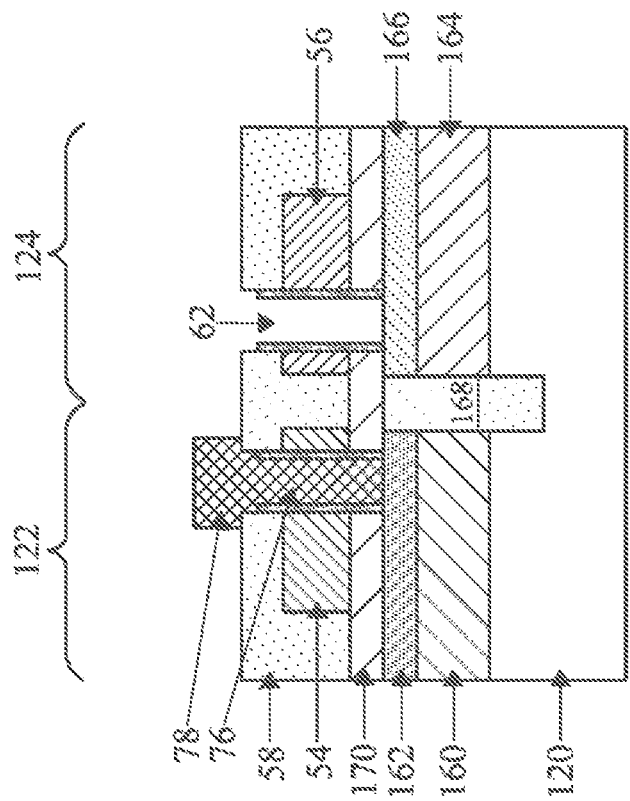
Figure 28:
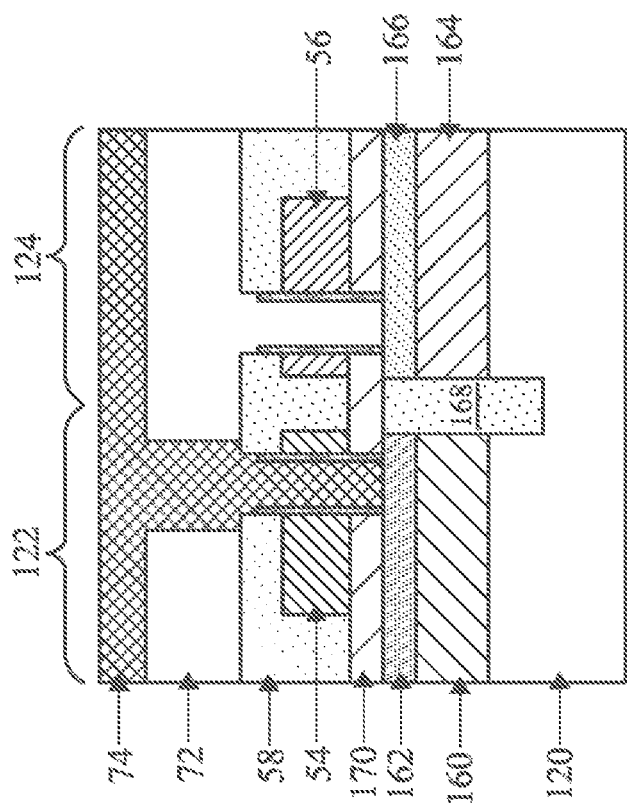

In FIGS. 28 and 29 and step 212 of FIG. 34, an n-doped bismuth-containing channel structure 76 is formed in the channel opening 60 in the first region 122, and a source/drain contact region 78 is formed on the n-doped bismuth-containing channel structure 76. In FIG. 28, a mask layer 72, such as a hardmask, is deposited on the second dielectric layer 58 and is patterned to expose the channel opening 60 in the first region 122. An opening through the mask layer 72 that exposes the channel opening 60 may have a larger lateral dimension than a corresponding lateral dimension of the channel opening 60. An n-doped bismuth-containing material 74 is then deposited in the channel opening 60 in the first region 122 while being prevented from being deposited in the channel opening 62 in the second region due to the mask layer 72.

In FIG. 29, excess bismuth-containing material 74 and the mask layer 72 are removed. Excess bismuth-containing material 74 can be removed using an acceptable planarization process. The planarization process can remove the excess bismuth-containing material 74 and/or the mask layer 72 until a source/drain contact region 78 formed from the n-doped bismuth-containing material 74 extends an appropriate height above the second dielectric layer 58. After the planarization process, remaining portions of the mask layer 72 can be removed using an acceptable etch. In addition to the source/drain contact region 78 formed from the n-doped bismuth-containing material 74, the remaining portion of the n-doped bismuth-containing material 74 in the channel opening 60 forms the n-doped bismuth-containing channel structure 76 in the first region 122. The n-doped bismuth-containing channel structure 76 is connected to the highly doped source/drain contact region 162 in the first region 122.

Figure 30:
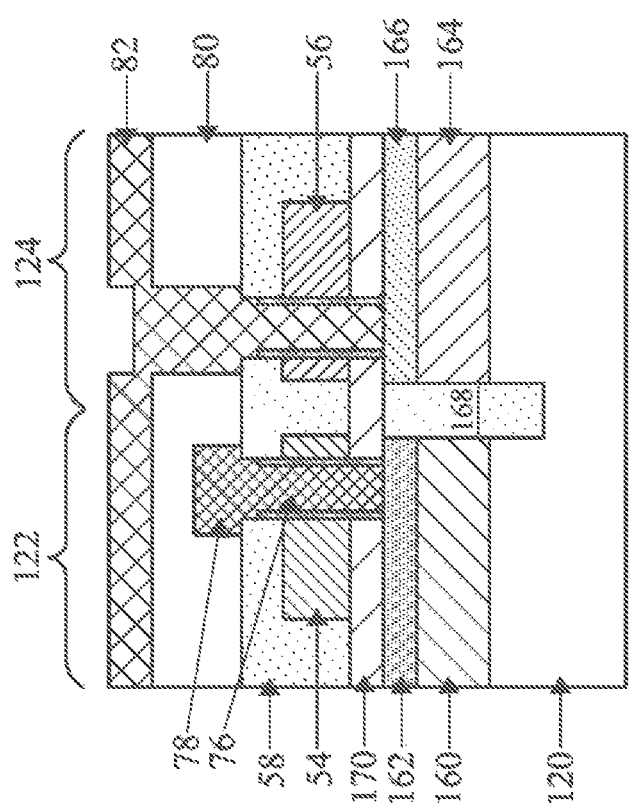

In FIGS. 30 and 31 and step 214 of FIG. 11, a p-doped bismuth-containing channel structure 84 is formed in the channel opening 62 in the second region 124, and a source/drain contact region 86 is formed on the p-doped bismuth-containing channel structure 84. In FIG. 30, a mask layer 80, such as a hardmask, is deposited on the second dielectric layer 58, on the source/drain contact region 78, and in the channel opening 62. The mask layer 80 is patterned to expose the channel opening 62 in the second region 124. An opening through the mask layer 80 that exposes the channel opening 62 may have a larger lateral dimension than a corresponding lateral dimension of the channel opening 62. A p-doped bismuth-containing material 82 is then deposited in the channel opening 62 in the second region 124.

In FIG. 31, excess bismuth-containing material 82 and the mask layer 80 are removed. Excess bismuth-containing material 82 can be removed using an acceptable planarization process. The planarization process can remove the excess bismuth-containing material 82 and/or the mask layer 80 until a source/drain contact region 86 formed from the p-doped bismuth-containing material 82 extends an appropriate height above the second dielectric layer 58. After the planarization process, remaining portions of the mask layer 80 can be removed using an acceptable etch. In addition to the source/drain contact region 86 formed from the p-doped bismuth-containing material 82, the remaining portion of the p-doped bismuth-containing material 82 in the channel opening 62 forms the p-doped bismuth-containing channel structure 84 in the second region 124. The p-doped bismuth-containing channel structure 84 is connected to the highly doped source/drain contact region 166 in the second region 124. Further in FIG. 31 and in step 216 of FIG. 34, a third dielectric layer 88 is formed on the source/drain contact regions 78 and 86 and the second dielectric layer 58.

In FIG. 32 and step 218 of FIG. 34, contacts 90a, 90b, 90c, 92a, 92b, and 92c are formed to respective components in an n-channel transistor 172 and a p-channel transistor 174. Contact 90a is physically and electrically coupled to the highly doped source/drain contact region 162 in the first region 122. Contact 90b is physically and electrically coupled to the gate electrode 54 in the first region 122. Contact 90c is physically and electrically coupled to the source/drain contact region 78 in the first region 122. Contact 92a is physically and electrically coupled to the highly doped source/drain contact region 166 in the second region 124. Contact 92b is physically and electrically coupled to the gate electrode 56 in the second region 124. Contact 92c is physically and electrically coupled to the source/drain contact region 86 in the second region 124. Contacts 90a and 92a may each be a source contact. Contacts 90b and 92b may each be a gate contact. Contacts 90c and 92c may each be a drain contact.

In step 220 of FIG. 34 and after the contacts 90a, 90b, 90c, 92a, 92b, and 92c are formed, the structure of FIG. 32 can be annealed to crystallize the bismuth-containing material in the structure, including the n-doped bismuth-containing channel structure 76 and the p-doped bismuth-containing channel structure 84. The anneal can be a low temperature anneal since the melting point of bismuth is low, e.g., 271.4° C., for crystallization. In some embodiments, the low temperature anneal is performed at a temperature of 400° C. or less, such as 300° C. or less, and more particularly at 275° C., for a duration in a range from about 0.01 seconds to about 300 seconds.

Figure 33A:
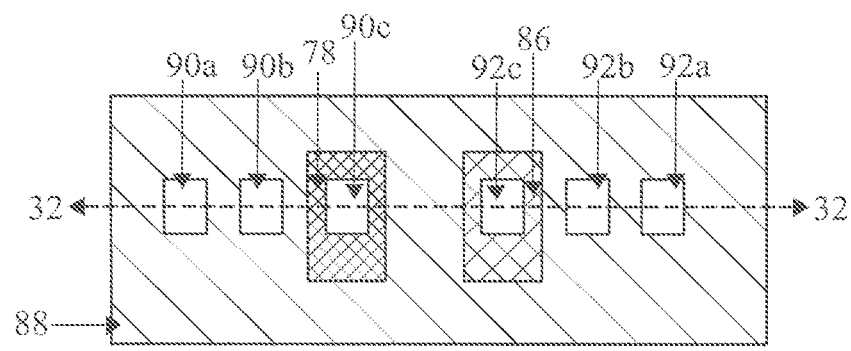
FIGS. 33A through 33C are overlaid layout views of the structure in FIG. 32 in accordance with some embodiments.
Figure 33B:
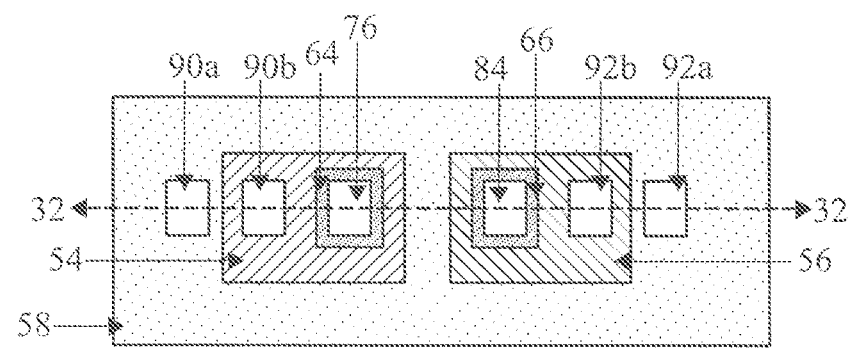
Figure 33C:
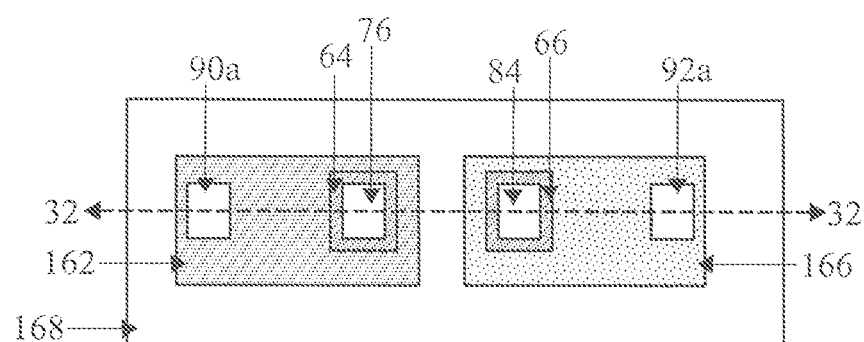

FIG. 32 further illustrates regions 33A, 33B, and 33C that are illustrated in overlaid layouts in FIGS. 33A, 33B, and 33C, respectively. The layout FIGS. 33A, 33B, and 33C illustrate in further detail components in FIG. 32. As can be seen in FIG. 33B, the gate electrodes 54 and 56 wrap around the n-doped bismuth-containing channel structure 76 and the p-doped bismuth-containing channel structure 84, respectively. The transistors 172 and 174 may therefore be referred to as vertical channel, all-around gate devices. FIGS. 33A, 33B, and 33C further illustrate a cross section 32-32 shown in FIG. 32.

Figure 36:
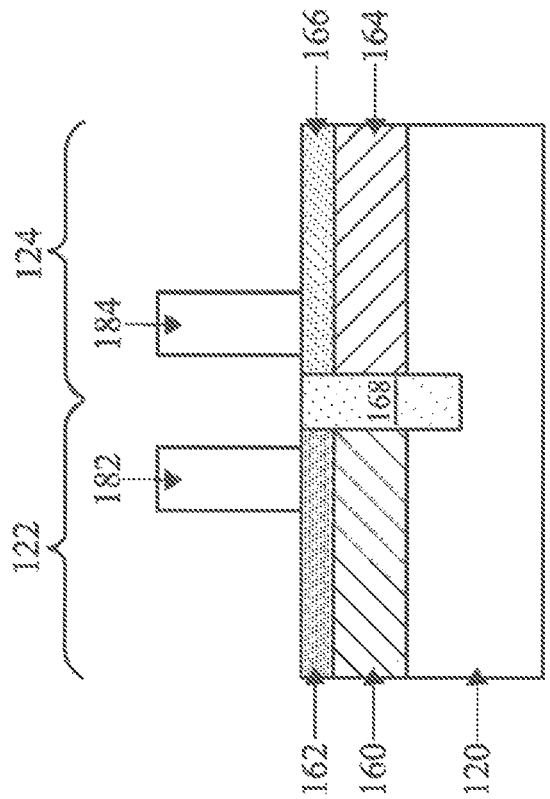
FIGS. 35 through 38 are cross sectional views of intermediate stages of manufacturing a complementary transistor structure in accordance with some embodiments.
Figure 35:
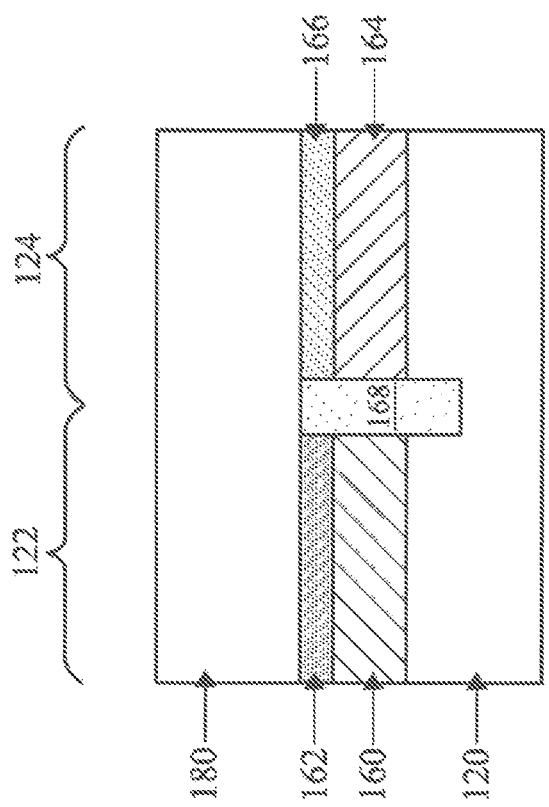
Figure 37:
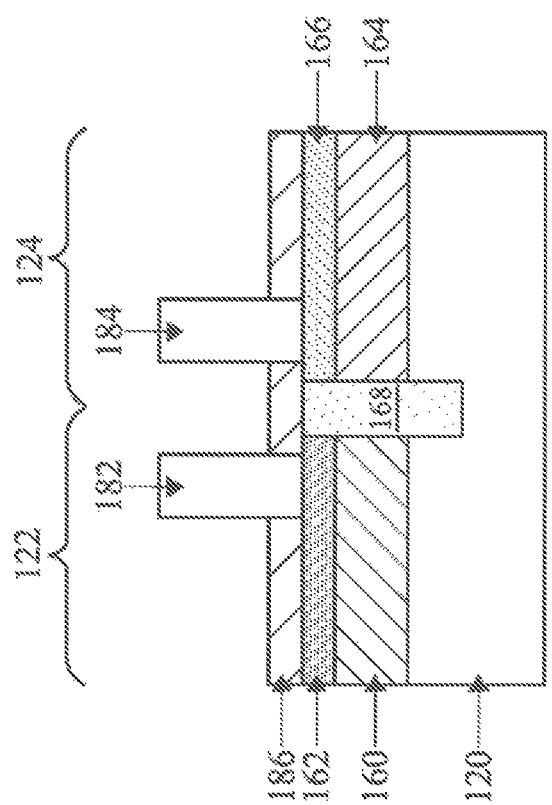
Figure 38:
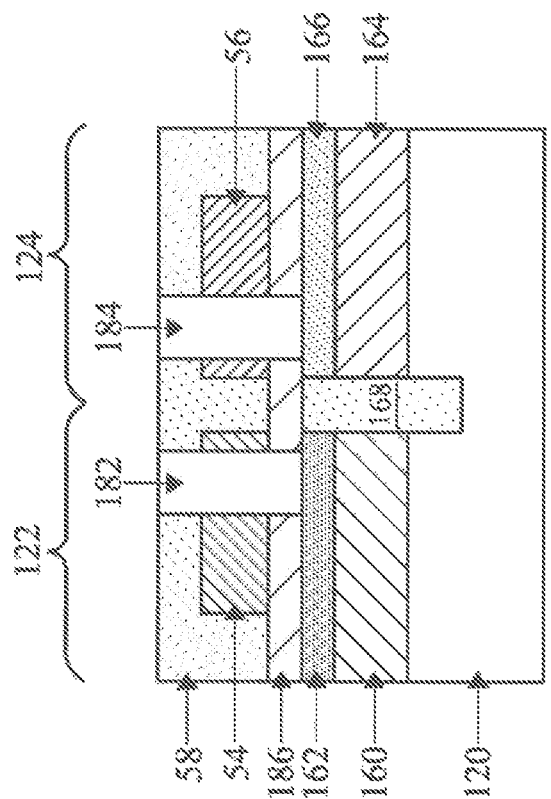
Figure 39:
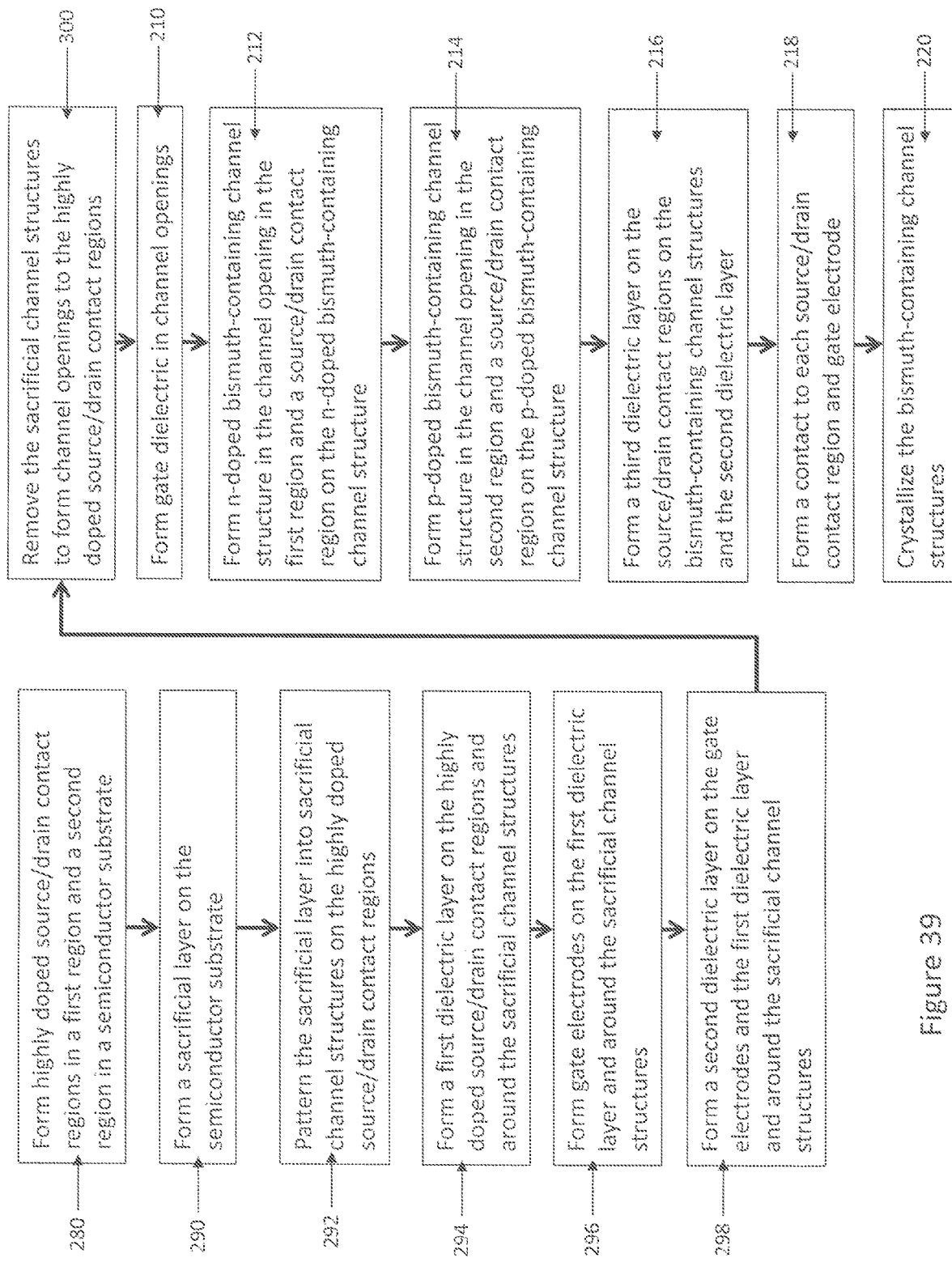
FIG. 39 is a flow chart of the process of FIGS. 35 through 38 in accordance with some embodiments.

FIGS. 35 through 38 illustrate cross sectional views of intermediate stages of manufacturing a complementary transistor structure in accordance with some embodiments. FIGS. 35 and 38 illustrate cross sectional views of another process to pattern channel openings 60 and 62. FIG. 39 is a flow chart of the process illustrated and described with respect to FIGS. 35 through 38, and the steps shown in FIG. 39 will be described in the context of FIGS. 35 through 38.

In FIG. 35 and in step 280 in FIG. 39, as discussed above with respect to FIG. 24 and step 280 in FIG. 34, highly doped source/drain contact regions 162 and 166 are formed in a first region 122 and a second region 124 in a semiconductor substrate 120. Continuing in FIG. 35 and in step 290 of FIG. 39, a sacrificial layer 180 is formed on the semiconductor substrate 120. The sacrificial layer 180 can be any material, e.g., that provides for a good etch selectivity for patterning channel openings 60 and 62. In some embodiments, the sacrificial layer 180 is a semiconductor material, such as silicon, silicon germanium, germanium, or the like, that is epitaxially grown, such as by using MOCVD, MBE, LPE, VPE, the like, or a combination thereof.

In FIG. 36 and in step 292 in FIG. 39, the sacrificial layer 180 is patterned into sacrificial channel structures 182 and 184 on the highly doped source/drain contact regions 162 and 166 in the first region 122 and the second region 124, respectively, of the semiconductor substrate 120. The patterning may use an acceptable photolithography and etching process, such as RIE, anisotropic plasma etching, or the like. Other patterning techniques may be used.

In FIG. 37 and in step 294 in FIG. 39, a first dielectric layer 186 is formed on the highly doped source/drain contact regions 162 and 166 and around the sacrificial channel structures 182 and 184. The first dielectric layer 186 can be formed by an appropriate deposition technique, such as CVD, PECVD, spin-on, the like, or a combination thereof, and can be formed of a dielectric material such as silicon oxide, PSG, BSG, BPSG, USG, a nitride, oxynitride, or the like. The first dielectric layer 186 can be initially deposited with a thickness greater than a height of the sacrificial channel structures 182 and 184. A CMP can be used to planarize the first dielectric layer 186, and a selective etch can be used to etch the first dielectric layer 186 to a desired thickness at a level below a top surface of the sacrificial channel structures 182 and 184, as illustrated.

In FIG. 38 and step 296 of FIG. 39, gate electrodes 54 and 56 are formed on the first dielectric layer 52 and around the sacrificial channel structures 182 and 184 in the first region 42 and the second region 44. The gate electrodes 54 and 56 can be formed by depositing a layer of conductive material on the first dielectric layer 186 to a thickness exceeding a height of the sacrificial channel structures 182 and 184. The layer of conductive material can then be planarized, such as by using a CMP. The layer of conductive material can then be recessed and patterned into the gate electrodes 54 and 56, such as by using an acceptable photolithography and etching process, such as RIE or the like. Other patterning techniques may be used.

Further in FIG. 38 and in step 298 of FIG. 39, a second dielectric layer 58 is formed on the gate electrodes 54 and 56 and the first dielectric layer 186 and around the sacrificial channel structures 182 and 184. The second dielectric layer 58 can be formed by an appropriate deposition technique and with any appropriate dielectric material. A CMP may be performed to planarize the second dielectric layer 58 and to expose the sacrificial channel structures 182 and 184 through the second dielectric layer 58.

In step 300 of FIG. 39, the sacrificial channel structures 182 and 184 are removed to form channel openings 60 and 62 to the highly doped source/drain contact regions 162 and 166, respectively. The removal can use an etch that is selective to the material of the sacrificial channel structures 182 and 184. The removal forms the channel openings 60 and 62 as illustrated in FIG. 26. Subsequent processing proceeds as previously described with respect to FIGS. 27 through 32 and steps 210 through 220.

Some embodiments contemplate a transistor with a channel comprising a material that is a semimetal in bulk but is a semiconductor as formed in the channel. An example of such a semimetal is a bismuth-containing material. Bismuth in bulk is a semimetal and has a negative band gap energy. When a dimension, such as a cross-sectional diameter, of bismuth is reduced to about 53 nm or less, bismuth becomes a semiconductor material. As a diameter of bismuth is reduced to 53 nm, the band gap energy reaches about zero and becomes positive, and as the diameter is reduced beyond 53 nm, the band gap energy remains positive and increases. The band gap energy can range from above 0 eV to about 1 eV for diameters between about 53 nm to about 5 nm, respectively. Accordingly, some embodiments contemplate that the dimensions 68 and 70 illustrated in the figures are 53 nm or less, such that a corresponding dimension of the bismuth-containing channel structures 76 and 84 are 53 nm or less. This can cause the bismuth-containing material in the bismuth-containing channel structures 76 and 84 to be a semiconductor. Some embodiments contemplate that a largest dimension of each of the cross sections of the bismuth-containing channel structures 76/84 illustrated in FIGS. 12A through 12H is 53 nm or less.

Bismuth has a relatively low melting point, and hence, can be easily deposited in an amorphous or polycrystalline form and subsequently crystallized into a monocrystalline trigonal structure. The melting point of bismuth is about 271.4° C. An anneal at a temperature above this melting point can melt bismuth, or a bismuth-containing material, and as bismuth, or the bismuth-containing material, cools, it forms a monocrystalline trigonal structure. Since bismuth, or a bismuth-containing material, can be crystallized at such a low temperature, e.g., below 400° C., and more particularly, below 300° C., the crystallization of the material can be easily integrated into and accomplished within temperature parameters of conventional processing. Additionally, the bismuth-containing material in the transistors, e.g., the n-doped bismuth-containing channel structure 76 and the source/drain contact region 78 in the n-type transistors 94 and 172, and the p-doped bismuth-containing channel structure 84 and the source/drain contact region 86 in the p-type transistors 96 and 174, are junctionless, e.g., do not have a p-n junction within the material. Hence, melting and crystalizing the bismuth-containing material after, e.g., the formation of contacts will not cause adverse diffusion of dopants within the bismuth-containing material.

Bismuth generally has a high carrier mobility. Doped bismuth can have an electron mobility close to the order of 105 $cm^2/(V \times S)$ when lightly doped or greater than 5,000 $cm^2/(V \times S)$ when heavily doped. Bismuth can have an electron mean free path of greater than or equal to about 100 nm, such as in a range from about 100 nm to about 1 µm. Further, bismuth can have a high effective mass, such as 1.2 $m_o$, in the direction of confinement and can have a high density of states and carrier concentrations. Bismuth can have a low effective mass, such as 0.0012 $m_o$, in the trigonal direction. These attributes of bismuth can cause a bismuth-containing channel to have a high current and a high speed.

An embodiment is a structure. The structure includes a substrate, a first source/drain contact region, a channel structure, a gate dielectric, a gate electrode, and a second source/drain contact region. The substrate has an upper surface. The channel structure is connected to and over the first source/drain contact region, and the channel structure is over the upper surface of the substrate. The channel structure has a sidewall that extends above the first source/drain contact region. The channel structure comprises a bismuth-containing semiconductor material. The gate dielectric is along the sidewall of the channel structure. The gate electrode is along the gate dielectric. The second source/drain contact region is connected to and over the channel structure.

Another embodiment is a structure. The structure comprises a substrate, a first vertical channel transistor, and a second vertical channel transistor. The substrate comprises a horizontal surface, and the horizontal surface is an upper surface of the substrate. The first vertical channel transistor is over the horizontal surface of the substrate. The first vertical channel transistor comprises a first source/drain contact region, a first bismuth-containing channel structure, a first gate dielectric, a first gate electrode, and a second source/drain contact region. The first bismuth-containing channel structure is connected to and over the first source/drain contact region. The first bismuth-containing channel structure is a semiconductor and comprises an n-type dopant. The first bismuth-containing channel structure extends perpendicular to the horizontal surface. The first gate dielectric is around the first bismuth-containing channel structure. The first gate electrode is around the first gate dielectric. The first gate dielectric is disposed between the first bismuth-containing channel structure and the first gate electrode. The second source/drain contact region is connected to and over the first bismuth-containing channel structure. The second vertical channel transistor is over the horizontal surface of the substrate. The second vertical channel transistor comprises a third source/drain contact region, a second bismuth-containing channel structure, a second gate dielectric, a second gate electrode, and a fourth source/drain contact region. Thea second bismuth-containing channel structure is connected to and over the third source/drain contact region. The second bismuth-containing channel structure is a semiconductor and comprises a p-type dopant. The second bismuth-containing channel structure extends perpendicular to the horizontal surface. The second gate dielectric is around the second bismuth-containing channel structure. The second gate electrode is around the second gate dielectric. The second gate dielectric is disposed between the second bismuth-containing channel structure and the second gate electrode. The fourth source/drain contact region is connected to and over the second bismuth-containing channel structure.

A further embodiment is a method. The method comprises forming a first source/drain contact region; forming a first gate electrode over the first source/drain contact region and over a substrate; forming a first opening through the first gate electrode to the first source/drain contact region; forming a first gate dielectric along a first sidewall of the first opening; depositing a first bismuth-containing material in the first opening to form a first bismuth-containing channel structure, the first gate dielectric being disposed between the first gate electrode and the first bismuth-containing channel structure, the first bismuth-containing channel structure being connected to the first source/drain contact region; forming a second source/drain contact region over and connected to the first bismuth-containing channel structure; and crystallizing the first bismuth-containing material, the crystallizing comprising performing an anneal.

One general aspect of embodiments disclosed herein includes a method including: forming a first source/drain contact region; forming a first gate electrode over the first source/drain contact region and over a substrate; forming a first opening through the first gate electrode to the first source/drain contact region; forming a first gate dielectric along a first sidewall of the first opening; depositing a first bismuth-containing semiconductor material in the first opening to form a first bismuth-containing channel structure, the first gate dielectric being disposed between the first gate electrode and the first bismuth-containing channel structure, the first bismuth-containing channel structure being connected to the first source/drain contact region; forming a second source/drain contact region over and connected to the first bismuth-containing channel structure; and crystallizing the first bismuth-containing semiconductor material, the crystallizing including performing an anneal.

Another general aspect of embodiments disclosed herein includes a method including: forming an isolation region in a substrate, where the isolation region is between a first and second region of the substrate, and where at least a portion of the isolation region is configured to extend from a top surface of the substrate; forming a first highly doped source/drain contact region in the first region of the substrate and a second highly doped source/drain contact region in the second region of the substrate. The method also includes forming a first gate electrode over the first highly doped source/drain contact region and in the first region of the substrate. The method also includes forming a second gate electrode over the second highly doped source/drain contact region and in the second region of the substrate; forming a first opening through the first gate electrode and to the first highly doped source/drain contact region; forming a second opening through the second gate electrode and to the second highly doped source/drain contact region. The method also includes depositing a first bismuth-containing semiconductor material in the first opening to form a first bismuth-containing channel structure being a semiconductor, the first bismuth-containing channel structure being connected to the first highly doped source/drain contact region. The method also includes depositing a second bismuth-containing semiconductor material in the second opening to form a second bismuth-containing channel structure being a semiconductor, the second bismuth-containing channel structure being connected to the second highly doped source/drain contact region. The method also includes forming a third source/drain contact region over and connected to the first bismuth-containing channel structure. The method also includes forming a fourth source/drain contact region over and connected to the second bismuth-containing channel structure; forming a dielectric layer over the third source/drain contact region and the fourth source/drain contact region; and crystallizing the first and second bismuth-containing semiconductor materials, the crystallizing including performing an anneal.

Yet another general aspect of embodiments disclosed herein includes a method including: forming a substrate. The method also includes forming a first source/drain contact region. The method also includes forming an opening connected to and over the first source/drain contact region, the opening being over an upper surface of the substrate, the opening having a sidewall extending above the first source/drain contact region. The method also includes forming a gate dielectric along the sidewall of the opening. The method also includes depositing a bismuth-containing semiconductor material in the opening to form a bismuth-containing channel structure, the gate dielectric being disposed between the opening and the bismuth-containing channel structure. The method also includes forming a second source/drain contact region connected to and over the bismuth-containing channel structure.

Yet another general aspect of embodiments disclosed herein includes a method including: forming an isolation region in a substrate, such that the isolation region is between a first and second region of the substrate. The method also includes epitaxially growing a first doped region in the first region of the substrate and epitaxially growing a first doped source/drain contact region on the first doped region. The method also includes epitaxially growing a second doped region in the second region of the substrate and epitaxially growing a second doped source/drain contact region on the second doped region. The method also includes forming a first gate electrode over the first doped source/drain contact region. The method also includes forming a second gate electrode over the second doped source/drain contact region. The method also includes forming a first opening through the first gate electrode and to the first doped source/drain contact region. The method also includes forming a second opening through the second gate electrode and to the second doped source/drain contact region. The method also includes depositing a first bismuth-containing semiconductor material in the first opening to form a first bismuth-containing channel structure, the first bismuth-containing channel structure being connected to the first doped source/drain contact region. The method also includes depositing a second bismuth-containing semiconductor material in the second opening to form a second bismuth-containing channel structure, the second bismuth-containing channel structure being connected to the second doped source/drain contact region. The method also includes crystallizing the first and second bismuth-containing semiconductor material, the crystallizing including performing an anneal.

Yet another general aspect of embodiments disclosed herein includes a method including: forming an isolation region in a substrate, such that the isolation region extends above an upper surface of the substrate. The method also includes epitaxially growing a first epitaxial layer adjacent a first sidewall of the isolation region, the first epitaxial layer being doped with a first dopant, the first dopant being a first type. The method also includes epitaxially growing a second epitaxial layer over the first epitaxial layer, the second epitaxial layer being doped with a second dopant, the second dopant being a second type opposite the first type. The method also includes epitaxially growing a third epitaxial layer adjacent a second sidewall of the isolation region, the second sidewall being opposite the first sidewall, the third epitaxial layer being doped with the second dopant. The method also includes epitaxially growing a fourth epitaxial layer over the second epitaxial layer, the fourth epitaxial layer being doped with the first dopant. The method also includes forming a conductive layer over the second epitaxial layer. The method also includes forming a first opening through the conductive layer to the second epitaxial layer. The method also includes forming a second opening through the conductive layer to the fourth epitaxial layer. The method also includes forming a semiconductor material in the first and second openings, such that forming the semiconductor material includes forming a bismuth-containing material in an amorphous or polycrystalline state, and further including annealing, the annealing crystallizing the bismuth-containing material.

Yet another general aspect of embodiments disclosed herein includes a method including: forming an isolation region in a substrate between a first region and a second region of the substrate recessing the substrate in the first region and the second region. The method also includes epitaxially growing a first doped region in the first region. The method also includes epitaxially growing a first highly doped source/drain contact region on the first doped region. The method also includes epitaxially growing a second doped region in the second region. The method also includes epitaxially growing a second highly doped source/drain contact region on the second doped region. The method also includes forming a conductive layer over the first and second highly doped source/drain contact regions. The method also includes forming a first opening through the conductive layer to the first highly doped source/drain contact region and forming a second opening through the conductive layer to the first highly doped source/drain contact region. The method also includes forming a gate dielectric along sidewalls of the first opening and the second opening. The method also includes forming a semiconductor material in the first opening and the second opening, the semiconductor material being amorphous or polycrystalline, the semiconductor material including a bismuth-containing material, and crystallizing the semiconductor material by annealing.

Yet another general aspect of embodiments disclosed herein includes a method including: forming a first contact region in a substrate. The method also includes forming a sacrificial layer over the first contact region. The method also includes patterning the sacrificial layer into a first sacrificial channel structure. The method also includes forming a first dielectric layer on the first contact region and around the first sacrificial channel structure. The method also includes forming a first gate electrode on the first dielectric layer and around the first sacrificial channel structure. The method also includes forming a second dielectric layer on the first gate electrode and on the first dielectric layer and around the first sacrificial channel structure. The method also includes removing the first sacrificial channel structure to form a first opening through the second dielectric layer, the first gate electrode, and the first dielectric layer to the first contact region. The method also includes forming a bismuth-containing material, the bismuth-containing material filling the first opening and crystallizing the bismuth-containing material.

Yet another general aspect of embodiments disclosed herein includes a method including: forming an isolation region in a substrate between a first region and a second region of the substrate. The method also includes recessing the substrate in the first region and the second region. The method also includes epitaxially growing a first doped region in the first region. The method also includes epitaxially growing a first conductive region on the first doped region. The method also includes epitaxially growing a second doped region in the second region. The method also includes epitaxially growing a second conductive region on the second doped region. The method also includes forming a sacrificial layer on the substrate. The method also includes patterning the sacrificial layer to form a first sacrificial structure on the first conductive region and a second sacrificial structure on the second conductive region. The method also includes forming a first dielectric layer on the first conductive region and on the second conductive region. The method also includes forming a first gate electrode on the first dielectric layer and around the first sacrificial structure and forming a second gate electrode on the first dielectric layer and around the second sacrificial structure. The method also includes removing the first sacrificial structure to form a first opening extending to the first conductive region and removing the second sacrificial structure to form a second opening extending to the second conductive region. The method also includes forming a bismuth-containing material in the first opening and the second opening and crystallizing the bismuth-containing material.

Yet another general aspect of embodiments disclosed herein includes a method including: removing a first sacrificial channel structure to form a first channel opening extending through a first gate electrode and a dielectric layer to a first doped region. The method also includes removing a second sacrificial channel structure to form a second channel opening extending through a second gate electrode the dielectric layer to a second doped region. The method also includes forming a first gate dielectric along sidewalls of the first channel opening and forming a second gate dielectric along sidewalls of the second channel opening. The method also includes forming an n-doped bismuth-containing structure in the first channel opening and a first bismuth-containing contact region on the n-doped bismuth-containing structure. The method also includes forming a p-doped bismuth-containing structure in the second channel opening and a second bismuth-containing contact region on the p-doped bismuth-containing structure. The method also includes crystallizing the n-doped bismuth-containing structure, the p-doped bismuth-containing structure, the first bismuth-containing contact region, and the second bismuth-containing contact region with an anneal.

Yet another general aspect of embodiments disclosed herein includes a semiconductor device including: a channel structure over a substrate, the channel structure including a bismuth-containing semiconductor material; a first source/drain contact region between the channel structure and the substrate; a dielectric layer over the first source/drain contact region, the channel structure extending through the dielectric layer; and a gate electrode over the dielectric layer, the gate electrode surrounding the channel structure in a plan view.

Yet another general aspect of embodiments disclosed herein includes a semiconductor device including: a first gate structure over a substrate; a second gate structure over the substrate, the first gate structure and the second gate structure being separated by a dielectric region; a first nanostructure extending through the first gate structure, the first nanostructure including crystalline bismuth, the first nanostructure being doped with an n-type dopant; and a second nanostructure extending through the second gate structure, the second nanostructure including crystalline bismuth, the second nanostructure being doped with a p-type dopant.

Yet another general aspect of embodiments disclosed herein includes a semiconductor device including: a substrate, wherein the substrate includes a plurality of devices; a first interconnect structure over the substrate, the first interconnect structure including a metallization pattern in a dielectric layer, wherein the plurality of devices are coupled through the first interconnect structure to form an integrated circuit; and a first transistor structure over the first interconnect structure, the first transistor structure including: a first contact region; a first channel structure over the first contact region, the first channel structure including a first semiconductor material, the first semiconductor material including bismuth; and a first gate structure surrounding a portion of the first channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a channel structure over a substrate, the channel structure comprising a bismuth-containing semiconductor material, wherein the bismuth-containing semiconductor material has a monocrystalline trigonal structure;
   a first source/drain contact region between the channel structure and the substrate;
   a dielectric layer over the first source/drain contact region, the channel structure extending through the dielectric layer; and
   a gate electrode over the dielectric layer, the gate electrode surrounding the channel structure in a plan view.

2. The semiconductor device of claim 1, wherein a largest dimension of the channel structure in the plan view is 53 nm or less.

3. The semiconductor device of claim 1, wherein a band gap energy of the bismuth-containing semiconductor material is in a range of 0 eV to 1 eV.

4. The semiconductor device of claim 1, wherein the bismuth-containing semiconductor material is free of p-n junctions.

5. The semiconductor device of claim 1, wherein the channel structure has a round cross section in the plan view.

6. The semiconductor device of claim 1, wherein the channel structure has a rectangular cross section in the plan view.

7. The semiconductor device of claim 6, wherein the rectangular cross section of the channel structure has rounded corners.

8. The semiconductor device of claim 1, further comprising a gate dielectric between the channel structure and the gate electrode, the gate dielectric surrounding the channel structure in the plan view.

9. A semiconductor device comprising:
   a substrate, wherein the substrate comprises a plurality of devices;
   a first interconnect structure over the substrate, the first interconnect structure comprising a metallization pattern in a dielectric layer, wherein the plurality of devices are coupled through the first interconnect structure to form an integrated circuit;
   a first transistor structure over the first interconnect structure, the first transistor structure comprising:
      a first contact region;
      a first channel structure over the first contact region, the first channel structure comprising a first semiconductor material, the first semiconductor material comprising bismuth; and
      a first gate structure surrounding a portion of the first channel structure; and
   a second transistor structure between the first interconnect structure and the first transistor structure, wherein the second transistor structure comprises:
      a second contact region; and
      a second channel structure over the second contact region, the second channel structure comprising monocrystalline bismuth.

10. The semiconductor device of claim 9, wherein the first interconnect structure further comprises a conductive via in the dielectric layer, wherein the integrated circuit is coupled to the first contact region through the conductive via.

11. The semiconductor device of claim 9, further comprising a second interconnect structure over the first transistor structure, the second interconnect structure comprising a first via, wherein the first channel structure is coupled to the first via.

12. The semiconductor device of claim 11, wherein the first transistor structure further comprises:
   a third contact region, the third contact region being separated from the first contact region by a dielectric region; and
   a third channel structure over the third contact region, the third channel structure comprising monocrystalline bismuth, wherein the first channel structure is doped with a first dopant and the third channel structure is doped with a second dopant, the first dopant and the second dopant having opposite conductivity types.

13. The semiconductor device of claim 12, wherein the second interconnect structure further comprises a second via, and wherein the second channel structure is coupled to the second via, the second via being coupled to the first via through the second interconnect structure.

14. The semiconductor device of claim 9, wherein the first channel structure has a triangular cross section in a plan view.

15. A semiconductor device comprising:
   an n-doped bismuth-containing structure over a substrate, wherein the n-doped bismuth-containing structure comprises an n-doped bismuth-containing channel;

a first source/drain contact region between the n-doped bismuth-containing structure and the substrate;

a p-doped bismuth-containing structure over the substrate, wherein the p-doped bismuth-containing structure comprises a p-doped bismuth-containing channel;

a second source/drain contact region between the p-doped bismuth-containing structure and the substrate;

a first dielectric layer over and in physical contact with both the first source/drain contact region and the second source/drain contact region, wherein both the n-doped bismuth-containing structure and the p-doped bismuth-containing structure extend through the first dielectric layer; and a second dielectric layer on a top surface of the first dielectric layer, wherein the second dielectric layer is in physical contact with the n-doped bismuth-containing structure and the p-doped bismuth-containing structure.

16. The semiconductor device of claim 15, further comprising a third dielectric layer surrounding the n-doped bismuth-containing structure, wherein the third dielectric layer has an elliptical cross section in a plan view.

17. The semiconductor device of claim 16, further comprising a fourth dielectric layer surrounding the p-doped bismuth-containing structure, wherein the fourth dielectric layer has a triangular cross section in the plan view.

18. The semiconductor device of claim 15, wherein the n-doped bismuth-containing structure has a hexagonal cross section in a plan view.

19. The semiconductor device of claim 18, wherein a largest dimension of the hexagonal cross section in the plan view is 53 nm or less.

20. The semiconductor device of claim 15, wherein the n-doped bismuth-containing structure comprises a bismuth-containing semiconductor material with a monocrystalline trigonal structure.

* * * * *